United States Patent
Kim et al.

(10) Patent No.: US 11,604,220 B2
(45) Date of Patent: Mar. 14, 2023

(54) TEST APPARATUSES FOR SEMICONDUCTOR DEVICES

(71) Applicant: Samsung Electronics Co., Ltd., Suwon-si (KR)

(72) Inventors: Hyung Il Kim, Asan-si (KR); Se-Hyun Seo, Hwaseong-si (KR); Byeong Min Yu, Asan-si (KR); Jae Hong Kim, Suwon-si (KR); Sang Jae Rhee, Seongnam-si (KR); Young Chyel Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/517,057

(22) Filed: Nov. 2, 2021

(65) Prior Publication Data
US 2022/0146571 A1    May 12, 2022

(30) Foreign Application Priority Data
Nov. 6, 2020    (KR) .................... 10-2020-0147656

(51) Int. Cl.
G01R 31/28    (2006.01)
G01R 1/04    (2006.01)

(52) U.S. Cl.
CPC ........ *G01R 31/2891* (2013.01); *G01R 1/0408* (2013.01); *G01R 31/2863* (2013.01)

(58) Field of Classification Search
CPC ............ G01R 31/2891; G01R 31/2863; G01R 1/0408
See application file for complete search history.

(56) References Cited

U.S. PATENT DOCUMENTS 5,247,248 A * 9/1993 Fukunaga .......... G01R 31/2863
324/750.25
9,007,085 B2    4/2015 Seo
(Continued)

FOREIGN PATENT DOCUMENTS

JP    4162058 B2    10/2008
JP    2013-002953 A    1/2013
(Continued)

OTHER PUBLICATIONS

Translation of KR102072122B1, Apr. 2020, Taekwang Choi 최태광 H 01 F 7/206 (Year: 2020).*

*Primary Examiner* — Paresh Patel
(74) *Attorney, Agent, or Firm* — Harness, Dickey & Pierce, P.L.C.

(57) ABSTRACT

A test apparatus includes a first module configured to structurally support a target semiconductor device, and a second module reversibly attachable to the first module. The first module includes a first housing including one or more inner surfaces at least partially defining an inner space, a volume control unit configured to control a volume of the inner space, a mounting unit at least partially exposed to the inner space and configured to be exposed to the target semiconductor device, and a magnetic force control unit in the first housing. The second module includes a second housing, a test board in the second housing, and an attachable/detachable member in the second housing. The test board may be electrically connected to the target semiconductor device. The magnetic force control unit may control a magnetic property of the attachable/detachable member to cause the attachable/detachable member to attach/detach to/from the magnetic force control unit.

20 Claims, 24 Drawing Sheets

(56) References Cited

U.S. PATENT DOCUMENTS

| | | |
|---|---|---|
| 10,228,418 B2 | 3/2019 | Chigullapalli et al. |
| 2013/0113513 A1* | 5/2013 | Seo ............... G01R 1/0483 |
| | | 324/756.02 |
| 2015/0185280 A1* | 7/2015 | Vaucher ......... G01R 31/2891 |
| | | 324/754.17 |
| 2015/0204942 A1* | 7/2015 | Scocchetti ........ G01R 1/0458 |
| | | 324/750.05 |
| 2017/0123001 A1* | 5/2017 | Chigullapalli ..... G01R 1/0483 |

FOREIGN PATENT DOCUMENTS

| | | |
|---|---|---|
| KR | 10-1619801 B1 | 5/2016 |
| KR | 10-2017-0004040 A | 1/2017 |
| KR | 10-1881110 B1 | 7/2018 |

* cited by examiner

100

TEST APPARATUSES FOR SEMICONDUCTOR DEVICES

CROSS-REFERENCE TO RELATED APPLICATION

This application claims priority from Korean Patent Application No. 10-2020-0147656 filed on Nov. 6, 2020 in the Korean Intellectual Property Office, and all the benefits accruing therefrom under 35 U.S.C. 119, the contents of which in its entirety are herein incorporated by reference.

BACKGROUND

1. Technical Field

The inventive concepts relate to test apparatuses for semiconductor devices.

2. Description of the Related Art

A test apparatus may be used for inspecting electrical characteristics of a semiconductor device. The test apparatus may determine whether or not a semiconductor device is defective by applying an electric signal to the semiconductor device and detecting and analyzing a signal outputted in response to the applied electric signal.

The test apparatus may include a test board. The test board may include needles configured to be in contact with electrode pads of the semiconductor device. The test apparatus may inspect the electrical characteristics of the semiconductor device by applying an electrical signal to the semiconductor device through the needles.

SUMMARY

Aspects of the inventive concepts provide test apparatuses for semiconductor devices that has excellent efficiency, portability, and connectivity.

According to some example embodiments of the inventive concepts, a test apparatus for a semiconductor device may include a first module and a second module. The first module may be configured to structurally support a target semiconductor device on an upper surface of the first module. The second module may be reversibly attachable to the first module. The first module may include a first housing including one or more inner surfaces at least partially defining an inner space, a volume control unit configured to control a volume of the inner space, a mounting unit at least partially exposed to the inner space and configured to be exposed to the target semiconductor device that is structurally supported on the upper surface of the first module, and a magnetic force control unit in the first housing. The second module may include a second housing, a test board in the second housing, and an attachable/detachable member in the second housing. The test board may be configured to be electrically connected to the target semiconductor device that is structurally supported on the upper surface of the first module. The magnetic force control unit may be configured to control a magnetic property of the attachable/detachable member to cause the attachable/detachable member to attach to the magnetic force control unit or detach from the magnetic force control unit.

According to some example embodiments of the inventive concepts, a test apparatus for a semiconductor device may include a first module and a second module. The first module may be configured to structurally support a target semiconductor device on an upper surface of the first module. The second module may be reversibly attachable to the first module. The first module may include a first housing including one or more inner surfaces at least partially defining an inner space, an elastic body in the inner space, a volume control unit configured to control a volume of the inner space based on at least partially compressing the elastic body, a mounting unit configured at least partially exposed to the inner space and configured to be exposed to the target semiconductor device that is structurally supported on the upper surface of the first module, and a magnetic force control unit in the first housing. The second module may include a second housing, a connection pad exposed from the second housing, a test board in the second housing, and an attachable/detachable member in the second housing. The test board may be configured to be electrically connected to the target semiconductor device that is structurally supported on the upper surface of the first module. The attachable/detachable member may include a magnetic material such that the attachable/detachable member is configured to be attached to the magnetic force control unit and detached from the magnetic force control unit.

According to some example embodiments of the inventive concepts, a test apparatus for a semiconductor device may include a first module and a second module. The first module may be configured to structurally support a target semiconductor device on an upper surface of the first module. The second module may include a test board. The test board may be configured to be electrically connected to the target semiconductor device that is structurally supported on the upper surface of the first module. The first module may include a housing including one or more inner surfaces at least partially defining an inner space, a mounting unit at least partially exposed to the inner space and configured to be exposed to the target semiconductor device that is structurally supported on the upper surface of the first module, a volume control unit configured to control a volume of the inner space to fix the target semiconductor device that is structurally supported on the upper surface of the first module on the mounting unit, and a magnetic force control unit in the housing. The magnetic force control unit may include a permanent magnet and a coil. The coil may be configured to control a magnetic flow of the permanent magnet.

However, aspects of the inventive concepts are not restricted to the example embodiments set forth herein. The above and other aspects of the inventive concepts will become more apparent to one of ordinary skill in the art to which the inventive concepts pertain by referencing the detailed description of the inventive concepts given below.

BRIEF DESCRIPTION OF THE DRAWINGS

The above and other aspects and features of the inventive concepts will become more apparent by describing in detail some example embodiments thereof with reference to the attached drawings, in which.

DETAILED DESCRIPTION

Figure 1:
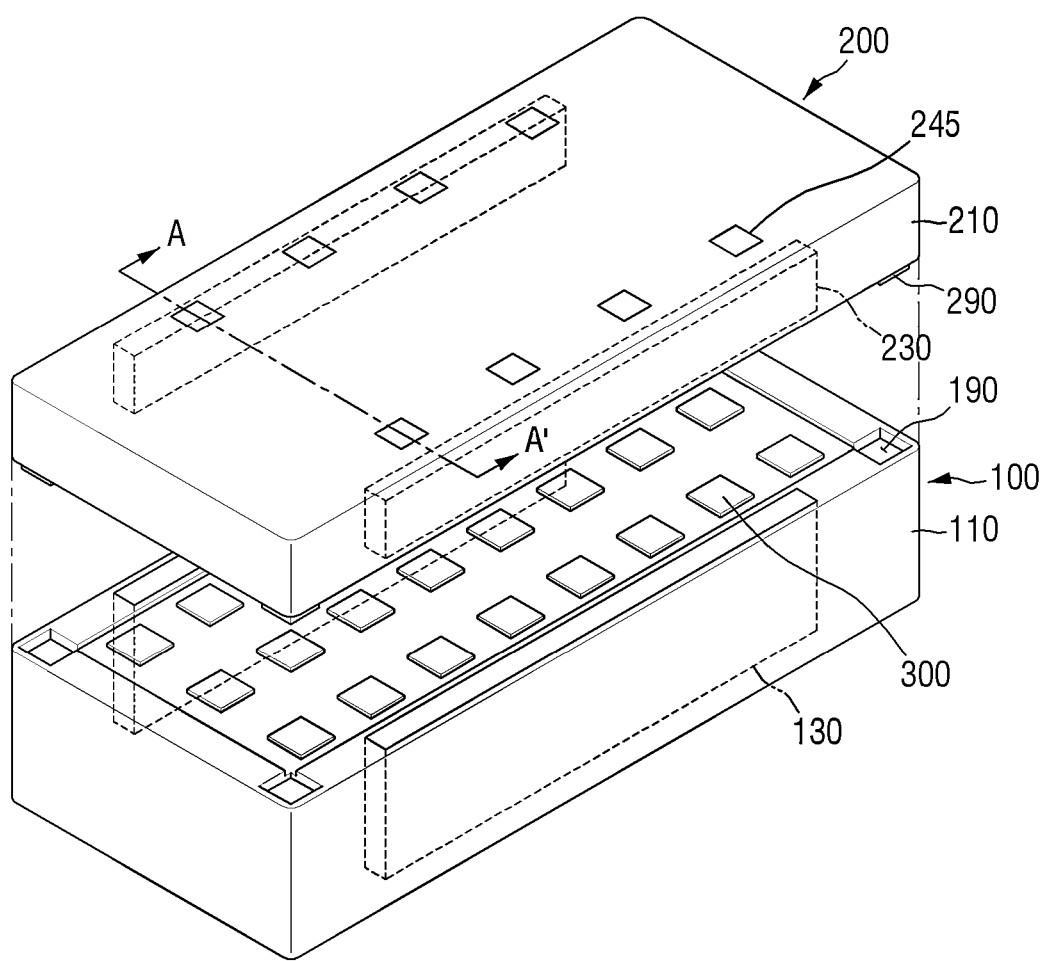
FIG. 1 is a schematic perspective view illustrating a test apparatus for a semiconductor device according to some example embodiments.

Hereinafter, a test apparatus for a semiconductor device according to some example embodiments will be described with reference to FIGS. 1 to 21.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
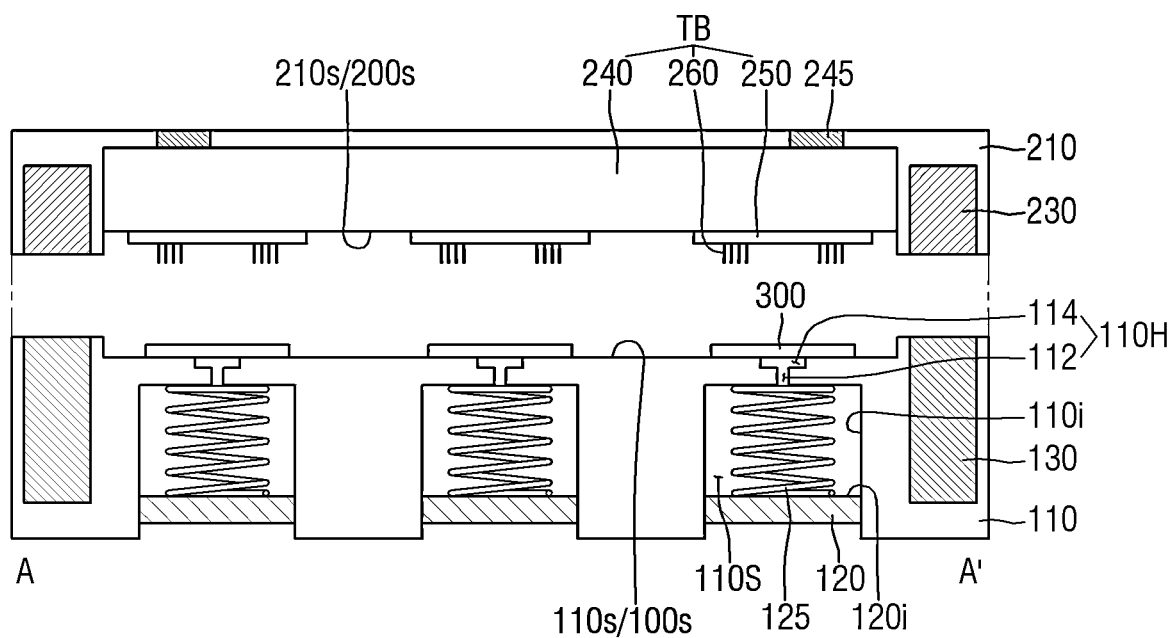
FIG. 2 is a schematic cross-sectional view taken along line A-A' of FIG. 1.
Figure 3:
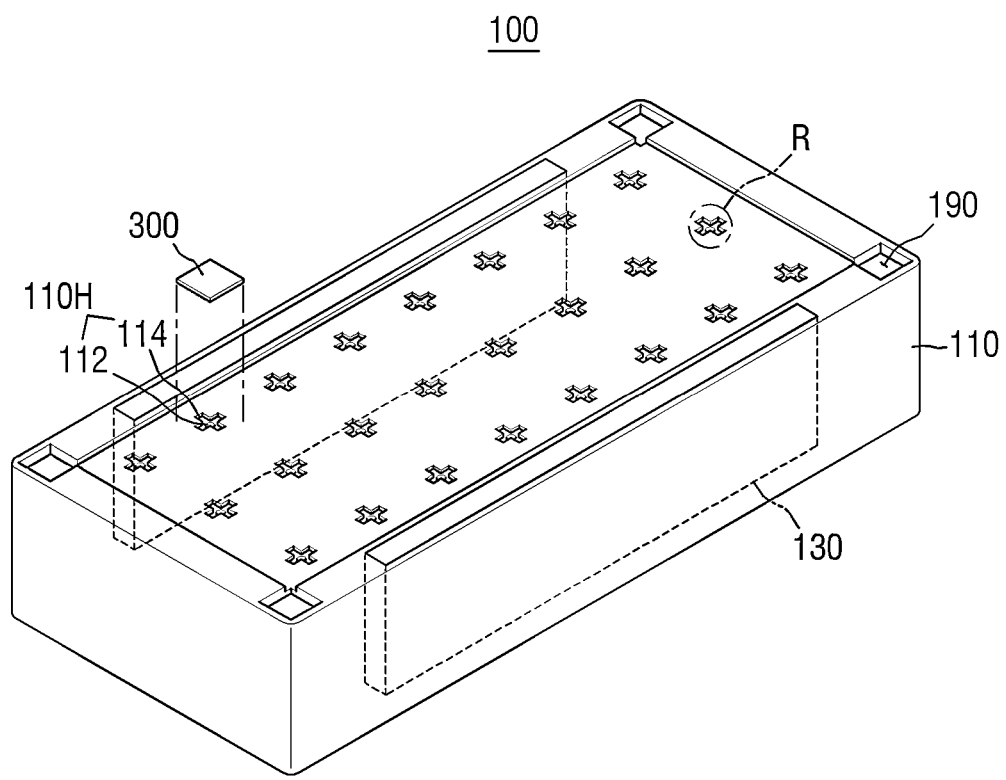
FIG. 3 is a schematic perspective view illustrating a first module of FIG. 1.
Figure 4A:
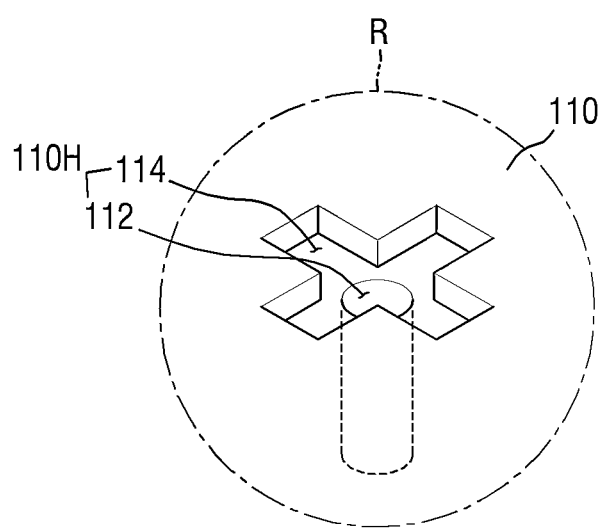
FIGS. 4A, 4B, and 4C are various enlarged views illustrating area R of FIG. 3.
Figure 4B:
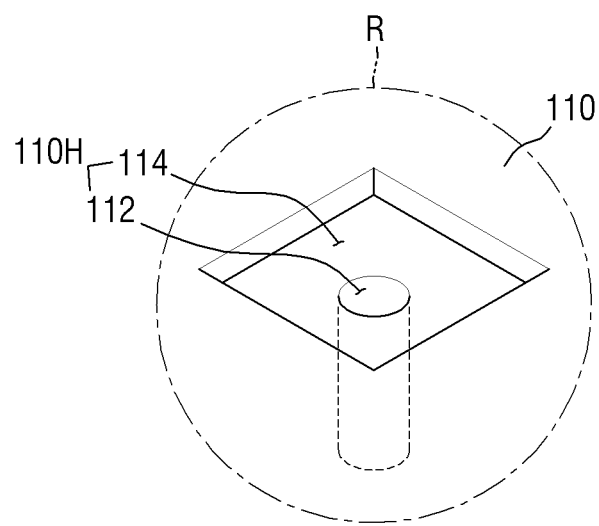
Figure 4C:
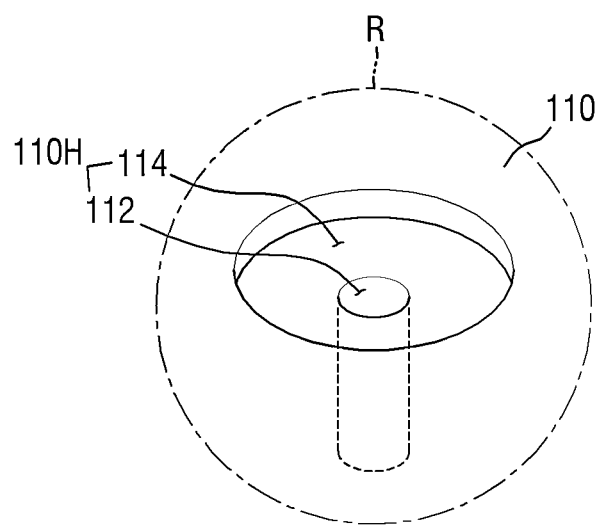
Figure 5:
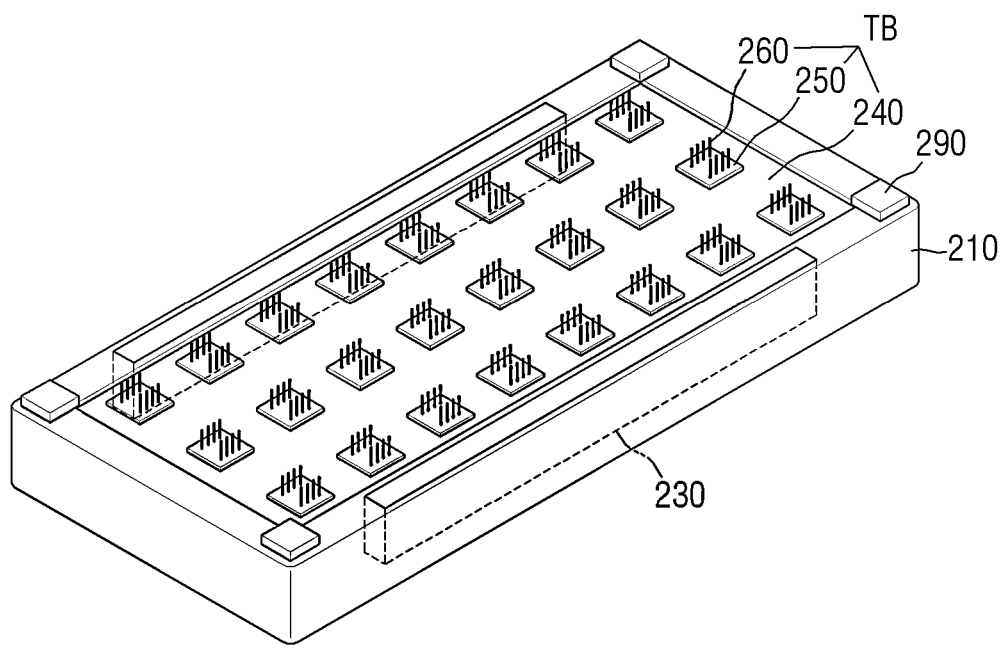
FIG. 5 is a schematic perspective view illustrating a second module of FIG. 1.

FIG. 1 is a schematic perspective view illustrating a test apparatus for a semiconductor device according to some example embodiments. FIG. 2 is a schematic cross-sectional view taken along line A-A' of FIG. 1. FIG. 3 is a schematic perspective view illustrating a first module of FIG. 1. FIGS. 4A, 4B, and 4C are various enlarged views illustrating area R of FIG. 3. FIG. 5 is a schematic perspective view illustrating a second module of FIG. 1.

Referring to FIGS. 1 to 5, a test apparatus for a semiconductor device according to some example embodiments includes a first module 100 and a second module 200.

A first target semiconductor device 300 may be mounted on the first module 100. Accordingly, it will be understood that the first module 100 may be configured to structurally support the first target semiconductor device 300 (e.g., support the weight thereof) on (e.g., directly on) an upper surface 100s of the first module 100. The first target semiconductor device 300 may be a test object whose electrical characteristics are inspected by a test apparatus for a semiconductor device according to some example embodiments. For example, the first target semiconductor device 300 may be, but not necessarily, a semiconductor package. For example, the first target semiconductor device 300 may include, partially or completely, a semiconductor package. For example, the first target semiconductor device 300 may include a wafer.

The second module 200 may be attached to and detached from (e.g., may be reversibly attachable to, may be detachably coupled to, etc.) the first module 100. The second module 200 may include a test board TB. By attaching the second module 200 to the first module 100, the test board TB may be electrically connected to the first target semiconductor device 300 mounted on the first module 100. Restated, the test board TB may be configured to be electrically connected to a first target semiconductor device 300 that is structurally support on an upper surface 100s of the first module 100. By detaching the second module 200 from the first module 100, the connection between the test board TB and the first target semiconductor device 300 may be released.

The first module 100 may include a first housing 110, a mounting unit 110H, a volume control unit 120, and a magnetic force control unit 130.

The first housing 110 may accommodate the volume control unit 120 and the magnetic force control unit 130 that will be described later. For example, the first housing 110 may surround the volume control unit 120 and the magnetic force control unit 130 disposed therein to protect them from the outside. Although it is illustrated that the first housing 110 has a rectangular tubular shape, this is merely an example, and the first housing 110 may have various shapes.

The first housing 110 may have an inner space 110S. Restated, the first housing 110 may have one or more inner surfaces 110i that at least partially define the inner space 110S within a volume space defined by outer surfaces of the first housing 110. The first housing 110 may be configured such that the volume of the inner space 110S is changed. For example, the volume of the inner space 110S may be changed by the volume control unit 120 to be described later. In some example embodiments, the first housing 110 may include a plurality of inner spaces 110S separated from each other.

The mounting unit 110H may be the region of the first module 100 where the first target semiconductor device 300 is disposed. The first target semiconductor device 300 may be attached to and detached from the mounting unit 110H. A detailed description thereof will be given later with reference to FIGS. 7 to 11 and 18.

In some example embodiments, the first module 100 may include a plurality of mounting units 110H. The plurality of mounting units 110H may accommodate a plurality of first target semiconductor devices 300 corresponding thereto. Although it is illustrated in FIG. 3 that twenty-four mounting units 110H are arranged in a grid pattern, this is merely an example, and the number and the arrangement of the mounting units 110H may vary in some example embodiments.

In some example embodiments, and as shown in at least FIG. 2, the mounting unit 110H may communicate with (e.g., may be at least partially exposed to, may have a surface that is exposed to, and/or may have a surface that at least partially defines) the inner space 110S of the first housing 110. For example, the mounting unit 110H may include an attracting portion 114 and a communicating portion 112. The attracting portion 114 may be exposed from the surface of the first housing 110 (e.g., exposed from upper surface 100s may be a surface of the first housing 110) to attract the first target semiconductor device 300 and to cause the first target semiconductor device 300 to be fixed in place in relation to the first module 100. The attracting portion 114 may be, e.g., a trench formed by removing a part of the first housing 110. The communicating portion 112 may connect the attracting portion 114 to the inner space 110S of the first housing 110. The communicating portion 112 may be, e.g., a hole formed through a part of the first housing 110. The attracting portion 114 and the inner space 110S of the first housing 110 may communicate with each other through the communicating portion 112.

In some example embodiments, the width (e.g., in a direction parallel to the upper surface 100s) of the attracting portion 114 may be greater than the width (e.g., in the direction parallel to the upper surface 100s) of the communicating portion 112. In that case, the mounting unit 110H increases the contact area with the first target semiconductor device 300, so that it is possible to more stably attract the first target semiconductor device 300.

As shown in at least FIG. 2, the attracting portion 114 may be configured to overlap with (e.g., be directly or indirectly exposed to) a first target semiconductor device 300 structurally supported on the upper surface 100s of the first module 100. As illustrated in FIGS. 4A to 4C, the attracting portion 114 may have various shapes for attracting the first target semiconductor device 300. For example, the attracting portion 114 may have various shapes such as a cross shape (see FIG. 4A), a rectangular shape (see FIG. 4B), a circular shape (see FIG. 4C), and the like in plan view.

Although it is illustrated in FIGS. 4A to 4C that the communicating portion 112 has a circular shape, this is merely an example. For example, the communicating portion 112 may have various other shapes such as a polygonal tubular shape and the like as long as the attracting portion 114 and the inner space 110S of the first housing 110 are connected.

In some example embodiments, the plurality of mounting units 110H may be arranged to correspond to the plurality of inner spaces 110S of the first housing 110. For example, as shown in FIG. 2, the mounting units 110H may be arranged in one-to-one correspondence with the inner spaces 110S of the first housing 110. However, this is merely an example, and two or more mounting units 110H may share one inner space 110S in some example embodiments.

The volume control unit 120 may be disposed on the first housing 110. The volume control unit 120 may control the volume of the inner space 110S of the first housing 110. For example, where the inner space 110S is collectively at least partially defined by inner surface(s) 110i and an inner surface 120i of the volume control unit 120, the volume control unit 120 may (e.g., based on at least partially moving through the space at least partially defined by the inner surface(s) 110i independently of inner surface 120i) reduce or increase the volume of the inner space 110S of the first housing 110.

In some example embodiments, the volume control unit 120 may define the inner space 110S of the first housing 110. The volume control unit 120 may be moved to control the volume of the inner space 110S of the first housing 110. In one example, the volume control unit 120 may be moved toward the mounting unit 110H to reduce the volume of the inner space 110S of the first housing 110, for example prior to the first target semiconductor device 300 being disposed on the mounting unit 110H. Further, in one example, the volume control unit 120 may be moved to be distant from the mounting unit 110H to increase the volume of the inner space 110S of the first housing 110, for example after the first target semiconductor device 300 is disposed on the mounting unit 110H.

In some example embodiments, the first module 100 may further include an elastic body 125 having a restoring force. As shown in at least FIG. 2, the elastic body 125 may include, but not necessarily, e.g., a spring.

The elastic body 125 may be disposed in (e.g., at least partially within) the first housing 110. For example, the elastic body 125 may be disposed in (e.g., at least partially within) the inner space 110S of the first housing 110. The volume control unit 120 may control the volume of the inner space 110S of the first housing 110 using the elastic body 125. In one example, the volume control unit 120 may be configured to press (e.g., at least partially compress) the elastic body 125 to reduce the volume of the inner space 110S of the first housing 110. The elastic body 125 pressed by the volume control unit 120 may increase the volume of the inner space 110S of the first housing 110 due to the restoring force (e.g., in the absence of being compressed by the volume control unit 120). Restated, the elastic body 125 may be configured to exert a restoring force on the volume control unit 120 and/or the first housing 110 to increase the volume of the inner space 110S.

The magnetic force control unit 130 may be disposed in (e.g., at least partially within) the first housing 110. For example, as shown in at least FIGS. 1-3, the magnetic force control unit 130 may be disposed in the sidewall of the first housing 110. Although it is illustrated in FIGS. 1 and 3 that two magnetic force control units 130 are disposed in the sidewall of the first housing 110, this is merely an example, and the number and the arrangement of the magnetic force control units 130 may vary in some example embodiments.

The magnetic force control unit 130 may control the magnetic flow of a permanent magnet to attach, hold, and detach a magnetic body. For example, a magnetic force control device for controlling a magnetic flow is disclosed in Korean Registered Patent No. 10-2072122.

The second module 200 may include a second housing 210, the test board TB at least partially in (e.g., at least partially within) the second housing 210, and an attachable/detachable member 230.

The second housing 210 may accommodate the test board TB and the attachable/detachable member 230 that will be described later. For example, the second housing 210 may surround the test board TB and the attachable/detachable member 230 disposed therein to protect them from the outside. Although it is illustrated that the second housing 210 has a rectangular tubular shape, this is merely an example, and the second housing 210 may have various shapes.

In some example embodiments, the second housing 210 may be engaged with the first housing 110. For example, the second housing 210 may include a protrusion 290 protruding from the bottom surface thereof, and the first housing 110 may include a recess 190 recessed from the top surface thereof. The protrusion 290 of the second housing 210 may be disposed to correspond to the recess 190 of the first housing 110. When the second module 200 is attached to the first module 100, the protrusion 290 of the second housing 210 may be inserted into the recess 190 of the first housing 110. Accordingly, it will be understood that the first housing 110 may be configured to be engaged with the second housing 210.

Accordingly, the engaging force between the first module 100 and the second module 200 may be enhanced. For example, as the protrusion 290 of the second housing 210 is inserted into the recess 190 of the first housing 110, it is possible to enhance the engaging force between the first module 100 and the second module 200 against an external force acting in a direction parallel to the contact surface (the top surface 110s of the first housing 110 or the bottom surface 210s of the second housing 210, where the top surface 110s of the first housing 110 may at least partially comprise the upper surface 100s of the first module 100 and the bottom surface 210s of the second housing 210 may at least partially comprise the lower surface 200s of the second module 200) between the first housing 110 and the second housing 210.

Although it is illustrated that the recess 190 of the first housing 110 is disposed at the corner of the first housing 110, and the protrusion 290 of the second housing 210 is disposed at the corner of the second housing 210, this is merely an example.

The test board TB may be electrically connected to the first target semiconductor device 300 mounted on the first module 100. For example, the test board TB may include a circuit board 240, a tile board 250, and needles 260.

The circuit board 240 may be disposed on the second housing 210. The circuit board 240 may be fixed to the second housing 210. Wirings may be formed on the circuit board 240 to electrically connect an external device (e.g., a tester 420 in FIG. 14) to the second module 200. Further, the wirings of the circuit board 240 may rearrange wirings of the tile board 250 to be described later to facilitate the connection between the external device and the second module 200. In one example, the circuit board 240 may include, but not necessarily, a printed circuit board (PCB).

Although it is illustrated that the circuit board 240 is exposed from the second housing 210, this is merely an example, and the second housing 210 may cover the surface of the circuit board 240.

The tile board 250 may be disposed on (e.g., directly or indirectly on) the circuit board 240. The tile board 250 may be fixed on the circuit board 240. The tile board 250 may be disposed on the circuit board 240 to face the first target semiconductor device 300 mounted on the first module 100. The wirings may be formed on the tile board 250 to electrically connect the circuit board 240 to the needles 260 to be described later.

In some example embodiments, a plurality of tile boards 250 may be arranged on the circuit board 240. The plurality of tile boards 250 may be arranged to correspond to the plurality of first target semiconductor devices 300 mounted on the first module 100. For example, as shown in FIG. 2, the tile boards 250 may be arranged in one-to-one correspondence with the first target semiconductor devices 300. However, this is merely an example, and in some example embodiments two or more tile boards 250 may share one first target semiconductor device 300 or two or more first target semiconductor devices 300 may share one tile board 250.

The needles 260 may be disposed on the tile board 250. The needles 260 may protrude from the tile board 250. The needles 260 may be in contact with the electrode terminals of the first target semiconductor device 300 mounted on the first module 100 and thus may be configured to be connected to a first target semiconductor device 300 structurally supported on the upper surface 100s of the first module 100. The electrical signal transmitted to the test board TB may be applied to the first target semiconductor device 300 through the needles 260. Further, the electric signal outputted from the electrode terminals of the first target semiconductor device 300 may be applied to the test board TB through the needles 260.

A plurality of needles 260 may protrude from each of the tile boards 250. Although it is illustrated that eight needles 260 are disposed on each of the tile boards 250, this is only for simplicity of description.

The attachable/detachable member 230 may be disposed in (e.g., at least partially in) the second housing 210. For example, as shown in at least FIGS. 1-2 and 5, the attachable/detachable member 230 may be disposed in the sidewall of the second housing 210. At least a part of the attachable/detachable member 230 may be disposed in the second housing 210 to correspond to the magnetic force control unit 130 of the first module 100. Although it is illustrated in FIGS. 1 and 6 that two attachable/detachable members 230 corresponding to two magnetic force control units 130 are disposed in the sidewall of the second housing 210, this is merely an example, and the number ("quantity") and the arrangement of the attachable/detachable members 230 may vary in some example embodiments.

The magnetic force control unit 130 controls (e.g., is configured to control) the magnetic property of the attachable/detachable member 230 to attach/detach the attachable/detachable member 230 to/from the magnetic force control unit 130. Restated, the magnetic force control unit 130 may be configured to control a magnetic property of the attachable/detachable member 230 to cause the attachable/detachable member 230 to attach to the magnetic force control unit 130 or detach from the magnetic force control unit 130. For example, the magnetic force control unit 130 may control the magnetic property (e.g., magnetic field, electrical field, electrical current, etc.) of the attachable/detachable member 230 by controlling the magnetic flow (e.g., magnetic field) of the attachable/detachable member 230 and/or of the magnetic force control unit 130 to generate an attractive force between the magnetic force control unit 130 and the attachable/detachable member 230. Since the attractive force is generated between the magnetic force control unit 130 and the attachable/detachable member 230, the second module 200 may be attached to the first module 100. Alternatively, for example, the magnetic force control unit 130 may eliminate the attractive force between the magnetic force control unit 130 and the attachable/detachable member 230 by controlling the magnetic flow. Since the attractive force between the magnetic force control unit 130 and the attachable/detachable member 230 is eliminated, the second module 200 may be detached from the first module 100. A detailed description thereof will be given later with reference to FIGS. 12 to 16.

The attachable/detachable member 230 may contain (e.g., include) a magnetic material, e.g., a ferromagnetic material, that may configure the attachable/detachable member 230 to be attached to and detached from (e.g., reversibly attached to, detachably attached to, etc.) the magnetic force control unit 130, for example based on selectively controllable magnetic attraction between the attachable/detachable member 230 and the magnetic force control unit 130. For example, the attachable/detachable member 230 may contain, but not necessarily, a metal such as iron (Fe), nickel (Ni), cobalt (Co), or a combination thereof. In one example, the attachable/detachable member 230 may contain iron (Fe).

Although it is illustrated that the magnetic force control unit 130 is exposed from the first housing 110 and the attachable/detachable member 230 is exposed from the second housing 210, this is merely an example. If the first module 100 and the second module 200 may be attached by the attractive force between the magnetic force control unit 130 and the attachable/detachable member 230, the magnetic force control unit 130 may not be exposed from the first housing 110 or the attachable/detachable member 230 may not be exposed from the second housing 210.

In some example embodiments, the second module 200 may further include a connection pad 245. As shown in at least FIG. 2, the connection pad 245 may be electrically connected to the circuit board 240 and exposed from the surface of the second housing 210. The connection pad 245 may be used to connect the circuit board 240 to an external device (e.g., the tester 420 in FIG. 14). Although it is illustrated that the connection pad 245 is exposed from the top surface of the second housing 210, this is merely an example, and the connection pad 245 may be exposed from the side surface of the second housing 210.

In some example embodiments, the second module 200 may include a plurality of connection pads 245. Although it is illustrated in FIG. 1 that eight connection pads 245 are exposed from the surface of the second housing 210, this is merely an example, and the number and the arrangement of the connection pads 245 may vary in some example embodiments.

Figure 6A:
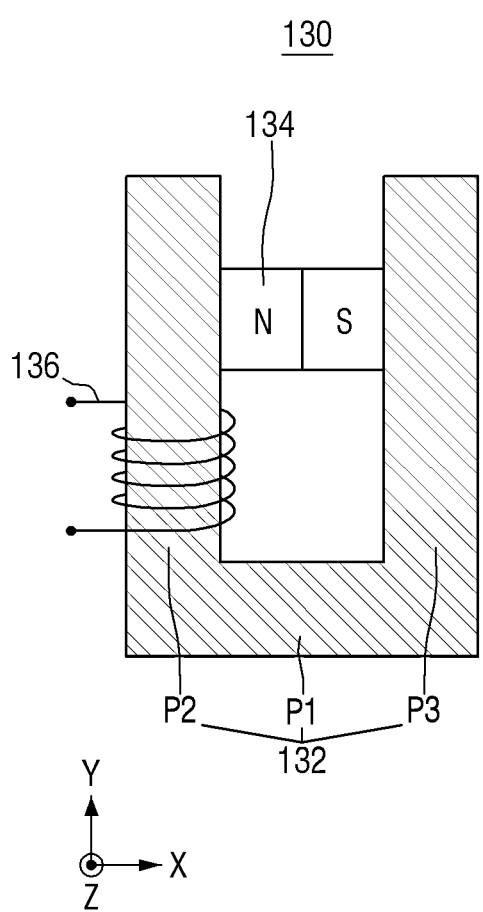
FIGS. 6A and 6B are various schematic conceptual diagrams illustrating a magnetic force control unit of a test apparatus for a semiconductor device according to some example embodiments.
Figure 6B:
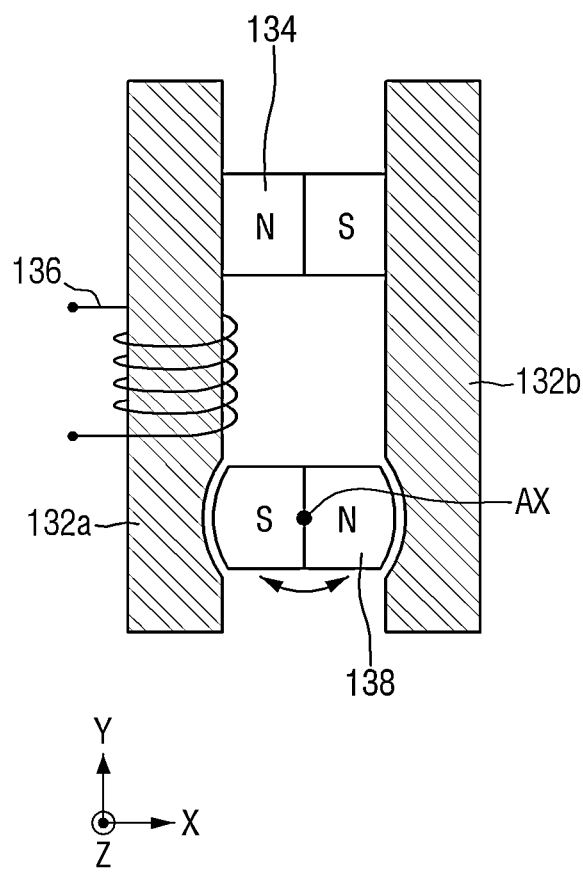

FIGS. 6A and 6B are various schematic conceptual diagrams illustrating a magnetic force control unit of a test apparatus for a semiconductor device according to some example embodiments. For simplicity of description, redundant parts of the description made with reference to FIGS. 1 to 5 may be recapitulated or omitted.

Referring to FIG. 6A, in a test apparatus for a semiconductor device according to some example embodiments, the magnetic force control unit 130 may include a permanent magnet 134, a first pole piece 132, and a coil 136.

The permanent magnet 134 may have an N pole and an S pole. For example, both poles (N pole and S pole) of the permanent magnet 134 may be arranged along a first direction X.

The first pole piece 132 may contain a ferromagnetic material. For example, the first pole piece 132 may contain, but not necessarily, at least one of iron (Fe), nickel (Ni), cobalt (Co), or a combination thereof. In one example, the first pole piece 132 may contain iron (Fe).

In some example embodiments, the first pole piece 132 may connect both poles (N pole and S pole) of the permanent magnet 134. For example, the first pole piece 132 may include a first elongated portion P1, a second elongated portion P2, and a third elongated portion P3. The first elongated portion P1 may be separated from the permanent magnet 134 in a second direction Y intersecting the first direction X, and may extend in the first direction X. The second elongated portion P2 may extend from one end of the first elongated portion P1 in the second direction Y and be connected to one end (e.g., N pole) of the permanent magnet 134. The third elongated portion P3 may extend from the other end of the first elongated portion P1 in the second direction Y and be connected to the other end (e.g., S pole) of the permanent magnet 134. In one example, the first pole piece 132 may be formed in a 'U' shape to connect both poles (N pole and S pole) of the permanent magnet 134.

The coil 136 may be wound around at least a part of the first pole piece 132. The coil 136 may form an electromagnet using a current applied from the outside. The electromagnet formed by the coil 136 may control the magnetic flow (e.g., magnetic field, electric field, electric current, etc.) of the permanent magnet 134. This will be described in detail with reference to FIGS. 12 to 16.

Although it is illustrated in FIG. 6A that the coil 136 is wound around the second elongated portion P2 of the first pole piece 132, this is merely an example. For example, the coil 136 may be further wound around at least one of the first elongated portion P1 or the third elongated portion P3, and may not be wound around the second elongated portion P2.

In some example embodiments, the coil 136 may be interposed between the permanent magnet 134 and the first elongated portion P1 of the first pole piece 132.

Referring to FIG. 6B, in a test apparatus for a semiconductor device according to some example embodiments, the magnetic force control unit 130 may include the permanent magnet 134, a second pole piece 132a, a third pole piece 132b, the coil 136, and a rotating permanent magnet 138.

Each of the second pole piece 132a and the third pole piece 132b may contain a ferromagnetic material. For example, the second pole piece 132a and the third pole piece 132b may, but not necessarily, contain at least one of iron (Fe), nickel (Ni), cobalt (Co), or a combination thereof. In one example, each of the second pole piece 132a and the third pole piece 132b may contain iron (Fe).

In some example embodiments, the second pole piece 132a and the third pole piece 132b may be connected to both poles (N and S poles) of the permanent magnet 134, respectively, while being separated from each other. For example, the second pole piece 132a may extend in the second direction Y and be connected to one end (e.g., N pole) of the permanent magnet 134, and the third pole piece 132b, isolated from direct contact with the second pole piece 132a, may extend in the second direction Y and be connected to the other end (e.g., S pole) of the permanent magnet 134.

The coil 136 may be wound around at least a part of the second pole piece 132a and/or the third pole piece 132b. Restated, the coil 136 may be wound around at least one of the second pole piece 132a or the third pole piece 132b. Although it is illustrated in FIG. 6B that the coil 136 is wound around the second pole piece 132a, this is merely an example. For example, the coil 136 may be wound around only the third pole piece 132b, and may be wound around both the second pole piece 132a and the third pole piece 132b.

The rotating permanent magnet 138 may have an N pole and an S pole. The rotating permanent magnet 138 may be separated from (e.g., isolated from direct contact with) the permanent magnet 134 and interposed between the second pole piece 132a and the third pole piece 132b. For example, the rotating permanent magnet 138 may be separated from the permanent magnet 134 in the second direction Y.

The rotating permanent magnet 138 may magnetically connect the second pole piece 132a to the third pole piece 132b. Here, "magnetically connected" means that two components are in physical contact with each other or separated from each other such that the magnetic flow is generated therebetween by the magnetic force even if they are not in physical contact with each other. For example, the magnetic flow may be generated in the second pole piece 132a and the third pole piece 132b by the magnetic force of the rotating permanent magnet 138.

The rotating permanent magnet 138 may be configured to be rotatable by the magnetic flow generated by the permanent magnet 134 or the coil 136. For example, as illustrated in FIG. 6B, the rotating permanent magnet 138 may rotate about a rotation axis AX extending in a third direction Z intersecting the first direction X and the second direction Y.

In some example embodiments, the coil 136 may be interposed between the permanent magnet 134 and the rotating permanent magnet 138.

Hereinafter, the operation of a test apparatus for a semiconductor device according to some example embodiments will be described with reference to FIGS. 7 to 16.

FIGS. 7, 8, 9, 10, 11, 12, 13, 14, 15, and 16 are diagrams illustrating the intermediate steps of the operation of a test apparatus for a semiconductor device according to some example embodiments. For simplicity of description, redundant parts of the description made with reference to FIGS. 1 to 6B may be recapitulated or omitted. For reference, FIGS. 7 to 16 illustrate that the magnetic force control unit 130 includes the permanent magnet 134, the second pole piece 132a, the third pole piece 132b, the coil 136, and the rotating permanent magnet 138.

Figure 7:
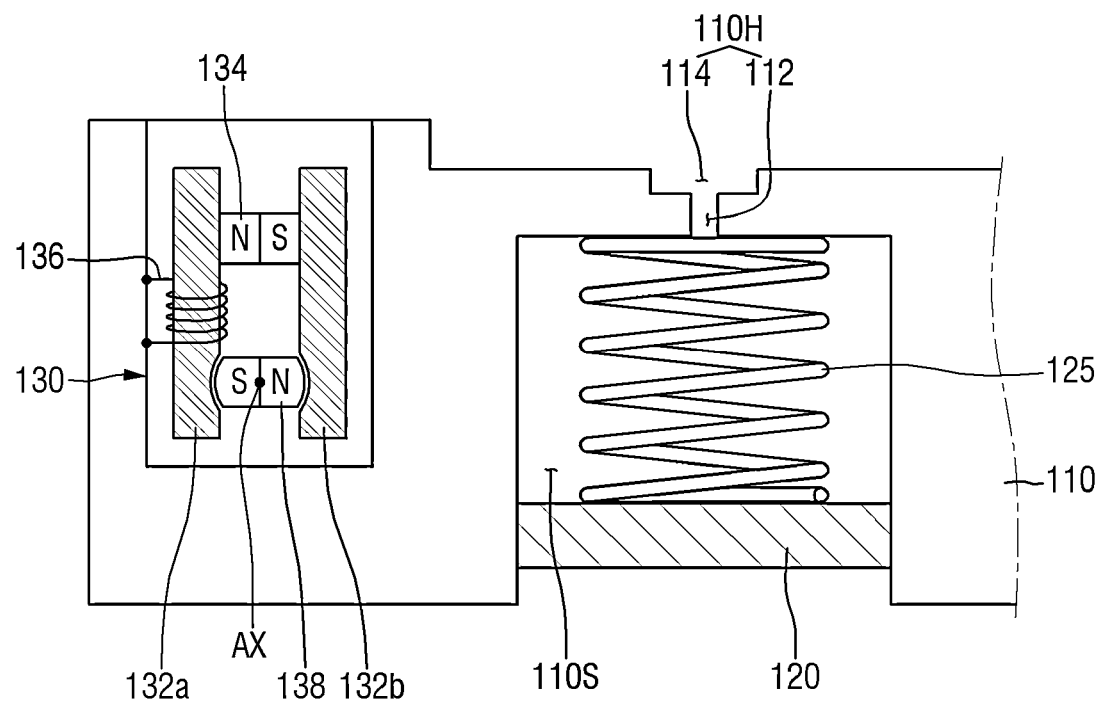
FIGS. 7, 8, 9, 10, 11, 12, 13, 14, 15, and 16 are diagrams illustrating the intermediate steps of the operation of a test apparatus for a semiconductor device according to some example embodiments.

Referring to FIG. 7, the first module 100 is provided.

The first module 100 may be provided in an idle state.

In the idle state, the volume control unit 120 may maintain the inner space 110S of the first housing 110 at a predetermined volume (first volume in the following). In some example embodiments, the elastic body 125 may be disposed in the inner space 110S of the first housing 110. In the idle state, the volume control unit 120 may not apply a force to the elastic body 125. Alternatively, in the idle state, the force applied by the volume control unit 120 to the elastic body 125 may be equal to the restoring force of the elastic body 125.

In some example embodiments, the mounting unit 110H communicating with the inner space 110S of the first housing 110 may be exposed to the outside (e.g., the atmosphere). Accordingly, the pressure in the inner space 110S of the first housing 110 may be maintained at the same level as an external pressure (e.g., the atmospheric pressure).

In the idle state, a current may not be applied to the coil 136 of the magnetic force control unit 130. Further, the permanent magnet 134 may magnetize the second pole piece 132a and the third pole piece 132b. As the second pole piece 132a and the third pole piece 132b are magnetized, the rotating permanent magnet 138 may be disposed in a specific state (referred to as a first arrangement state in the following). For example, as illustrated, the S pole of the rotating permanent magnet 138 may face the second pole piece 132a, and the N pole of the rotating permanent magnet 138 may face the third pole piece 132b.

Figure 8:
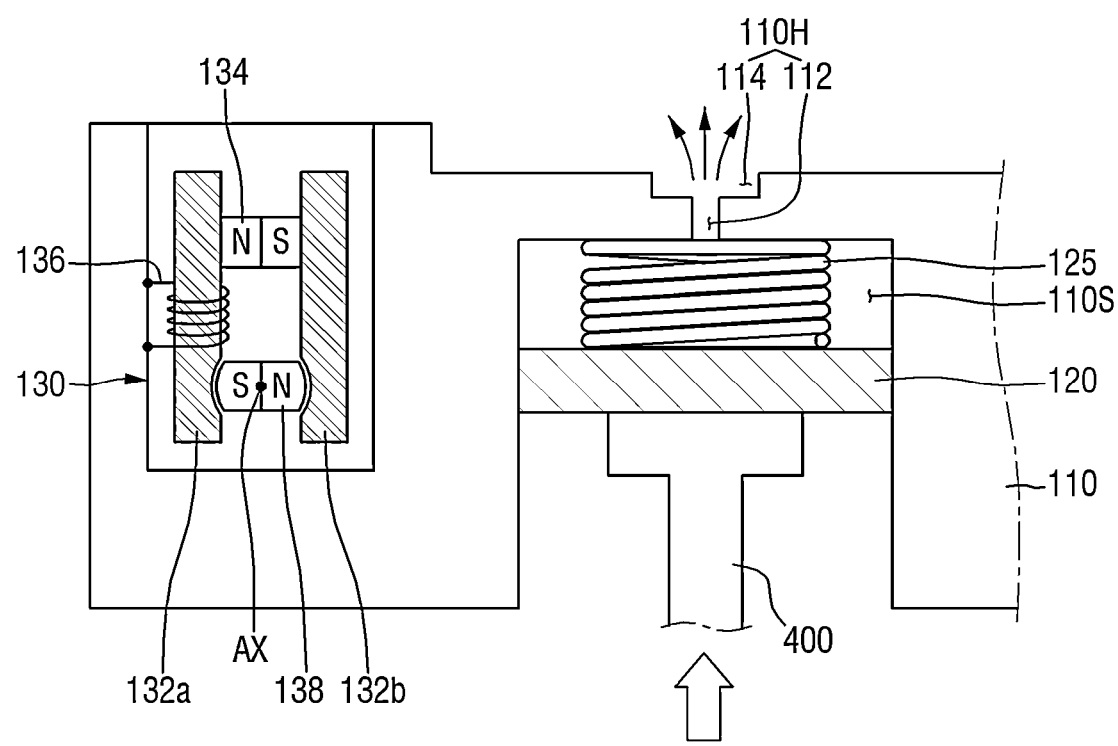

Referring to FIG. 8, the volume control unit 120 reduces the volume of the inner space 110S of the first housing 110.

In one example, a pressing member 400 may be disposed on the bottom surface of the volume control unit 120. The pressing member 400 may apply a force to the volume control unit 120 to reduce the volume of the inner space 110S of the first housing 110. For example, the pressing member 400 may be moved toward the mounting unit 110H to push up the volume control unit 120.

In some example embodiments, as the volume of the inner space 110S of the first housing 110 is reduced, the gas (e.g., the atmosphere) filling the inner space 110S of the first housing 110 may be discharged through the mounting unit 110H. Accordingly, the pressure in the inner space 110S of the first housing 110 may be maintained at the same level as the external pressure (e.g., the atmospheric pressure).

In some example embodiments, the elastic body 125 may be contracted as the volume of the inner space 110S of the first housing 110 is reduced by the volume control unit 120. The potential energy obtained by the restoring force may be stored in the contracted elastic body 125.

Figure 9:
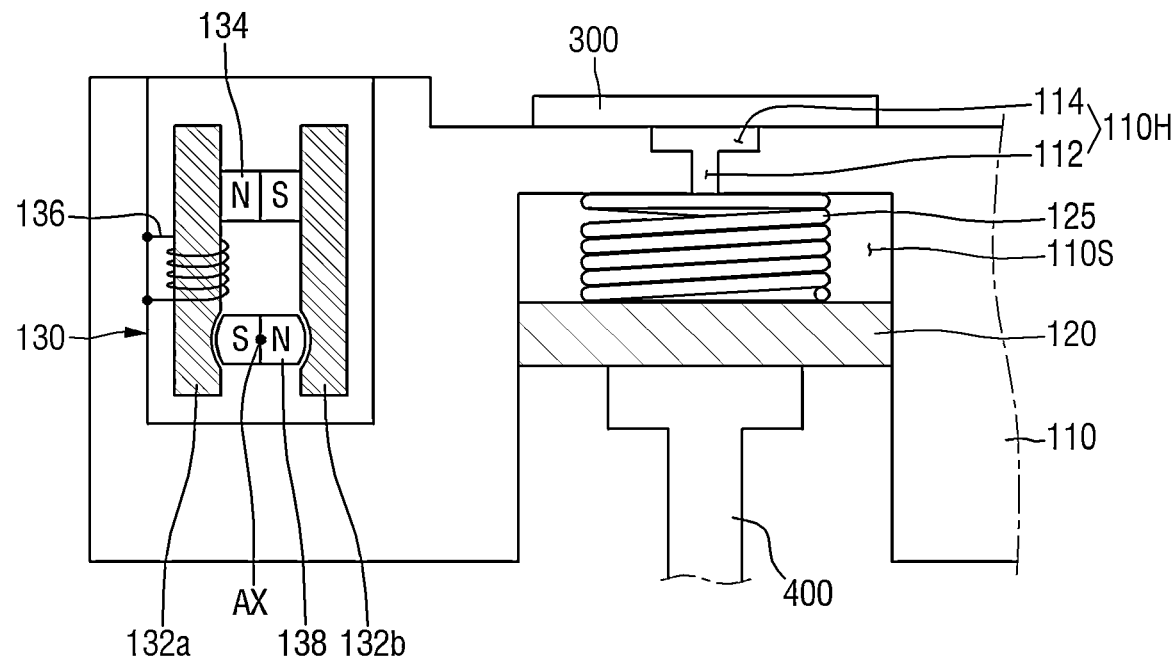

Referring to FIG. 9, the first target semiconductor device 300 is disposed on the mounting unit 110H.

For example, the first target semiconductor device 300 may be disposed on the attracting portion 114 of the mounting unit 110H. The first target semiconductor device 300 may be disposed to cover the mounting unit 110H. Accordingly, the inner space 110S of the first housing 110 may be blocked from the outside (e.g., the atmosphere).

Figure 10:
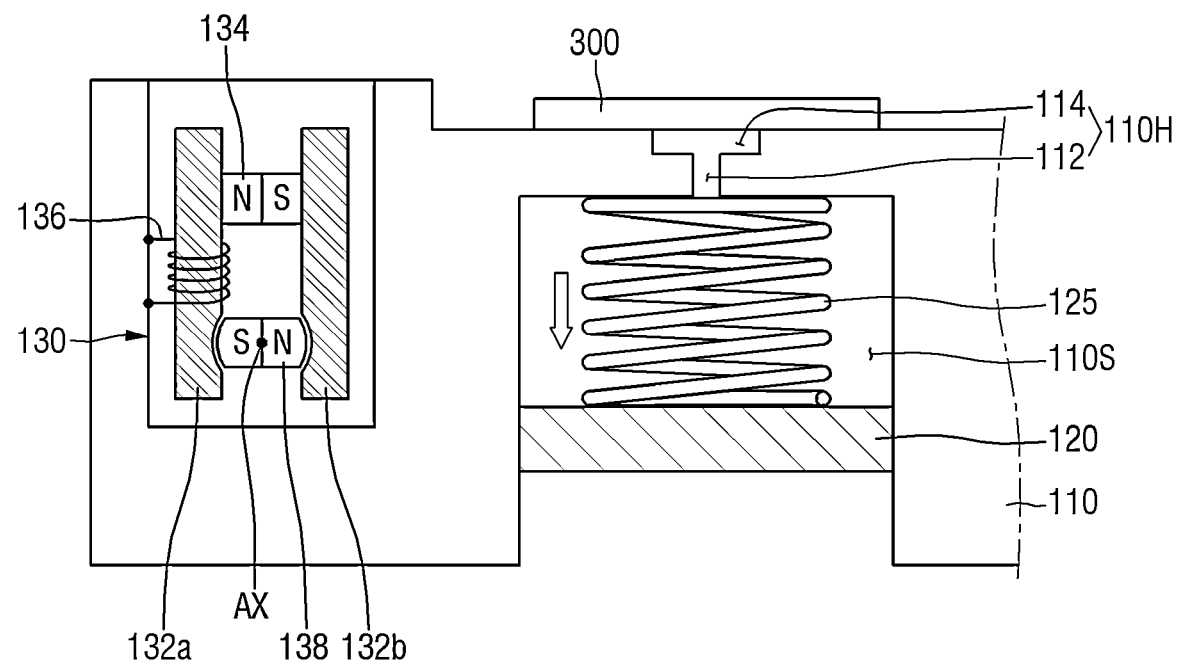

Referring to FIG. 10, the volume control unit 120 increases the volume of the inner space 110S of the first housing 110.

The pressure in the inner space 110S of the first housing 110 may be reduced as the volume of the inner space 110S of the first housing 110 is increased by the volume control unit 120. For example, since the inner space 110S of the first housing 110 may be blocked from the outside (e.g., the atmosphere) by the first target semiconductor device 300, the pressure in the inner space 110S of the first housing 110 may be lower than the external pressure (e.g., the atmospheric pressure). Accordingly, the mounting unit 110H communicating with the inner space 110S of the first housing 110 may attract the first target semiconductor device 300, and the first target semiconductor device 300 may be mounted on the first module 100. Accordingly, the volume control unit 120 may be configured to control a volume of the inner space 110S to cause the first target semiconductor device 300 to be fixed on and/or in relation to the mounting unit 110H.

In some example embodiments, the elastic body 125 may apply a force to the volume control unit 120 to increase the volume of the inner space 110S of the first housing 110. In one example, the pressing member 400 that pushes up the volume control unit 120 may be removed. Since the pressing member 400 is removed, the volume control unit 120 may be pulled down by the potential energy obtained by the restoring force stored in the elastic body 125.

In some example embodiments, the volume control unit 120 may maintain the inner space 110S of the first housing 110 at a predetermined volume (referred to as a second volume in the following) using the elastic body 125. In some example embodiments, the second volume may be smaller than the first volume.

Although it is illustrated in FIG. 10 that the inner space 110S of the first housing 110 is maintained at the predetermined volume using the elastic body 125, the technical spirit of the inventive concepts is not limited thereto.

Figure 11:
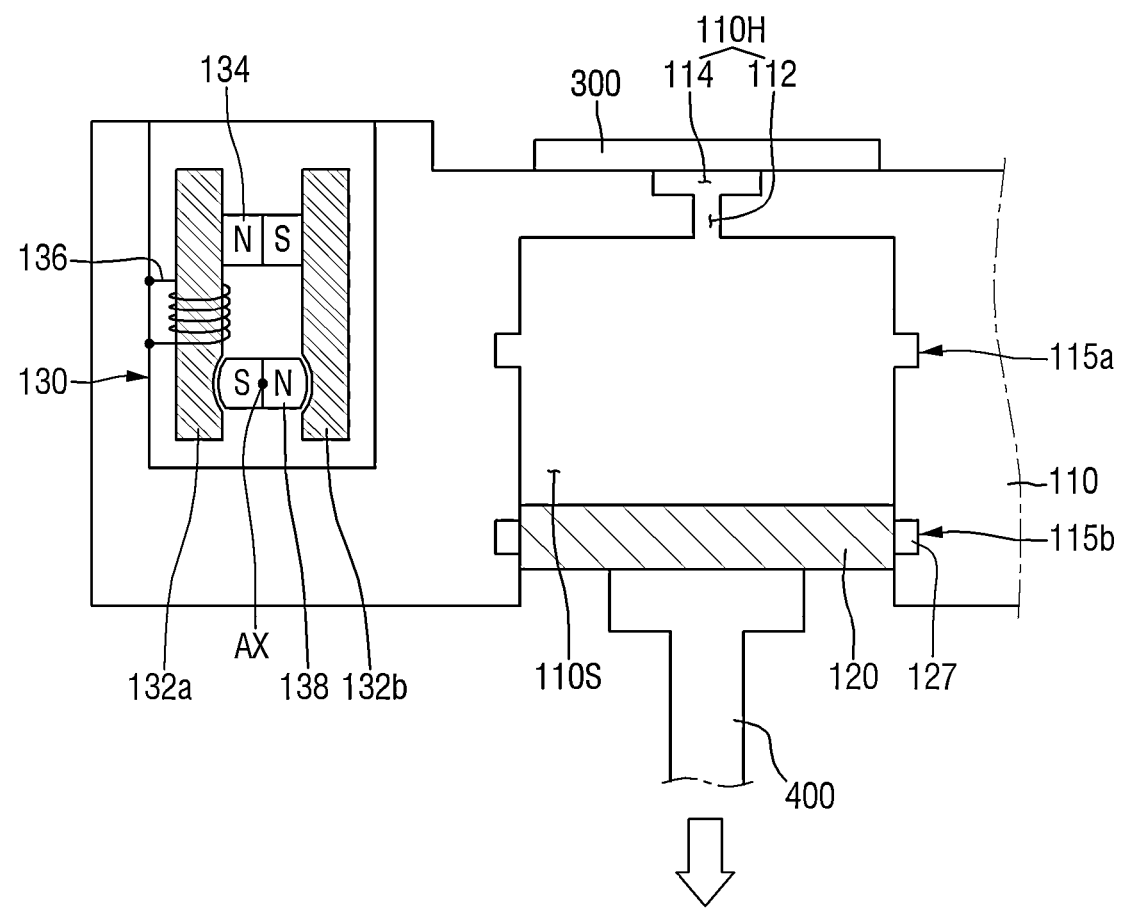

For example, as illustrated in FIG. 11, the elastic body 125 may not be disposed in the inner space 110S of the first housing 110. In one example, the pressing member 400 that pulls down the volume control unit 120 may be provided after the first target semiconductor device 300 is disposed on the mounting unit 110H. Then, the volume control unit 120 pulled down by the pressing member 400 may be engaged with and fixed to the first housing 110. For example, fastening protrusions 127 protruding from the volume control unit 120 may be formed. The fastening protrusions 127 of the volume control unit 120 may be fastened to engaging grooves 115a and 115b formed in the first housing 110. Accordingly, the volume control unit 120 may maintain the inner space 110S of the first housing 110 at a predetermined volume.

Figure 12:
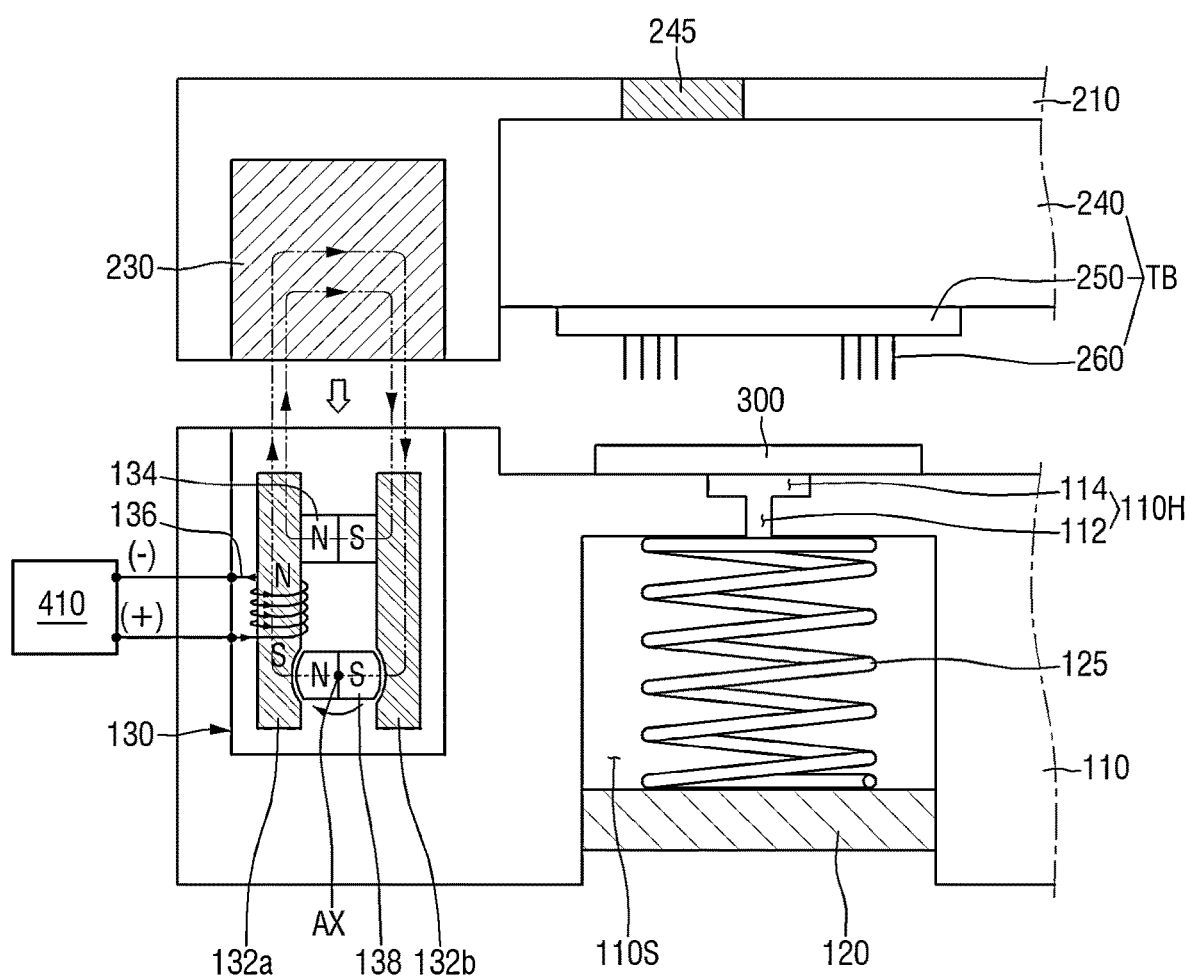

Referring to FIG. 12, the second module 200 is provided above the first module 100.

The second module 200 may be disposed such that a part of the attachable/detachable member 230 corresponds to the magnetic force control unit 130. For example, the bottom surface of the attachable/detachable member 230 may be disposed on the top surface of the magnetic force control unit 130.

After at least a part of the attachable/detachable member 230 is disposed to correspond to the magnetic force control unit 130, a current may be applied to the coil 136 of the magnetic force control unit 130. For example, a power supply 410 for applying a current to the coil 136 may be provided. For example, the power supply 410 may apply a direct current (DC) of about 20V to about 30V to the coil 136. Accordingly, the coil 136 may form an electromagnet.

The electromagnet formed by the coil 136 may control the magnetic property of the attachable/detachable member 230 by controlling the magnetic flow of the permanent magnet 134 to generate an attractive force between the magnetic force control unit 130 and the attachable/detachable member 230. For example, the N pole of the electromagnet formed by the coil 136 may face the N pole of the permanent magnet 134. Accordingly, the permanent magnet 134 may magnetize the attachable/detachable member 230, and the magnetic flow circulating through the permanent magnet 134 and the attachable/detachable member 230 may be generated.

Further, for example, the S pole of the electromagnet formed by the coil 136 may face the rotating permanent magnet 138. Accordingly, the rotating permanent magnet 138 may be rotated and arranged in a second arrangement state different from the first arrangement state. For example, as illustrated, the N pole of the rotating permanent magnet 138 may face the second pole piece 132a, and the S pole of the rotating permanent magnet 138 may face the third pole piece 132b. Accordingly, another magnetic flow circulating through the rotating permanent magnet 138 and the attachable/detachable member 230 may be generated, and the attractive force between the magnetic force control unit 130 and the attachable/detachable member 230 may be further enhanced.

Figure 13:
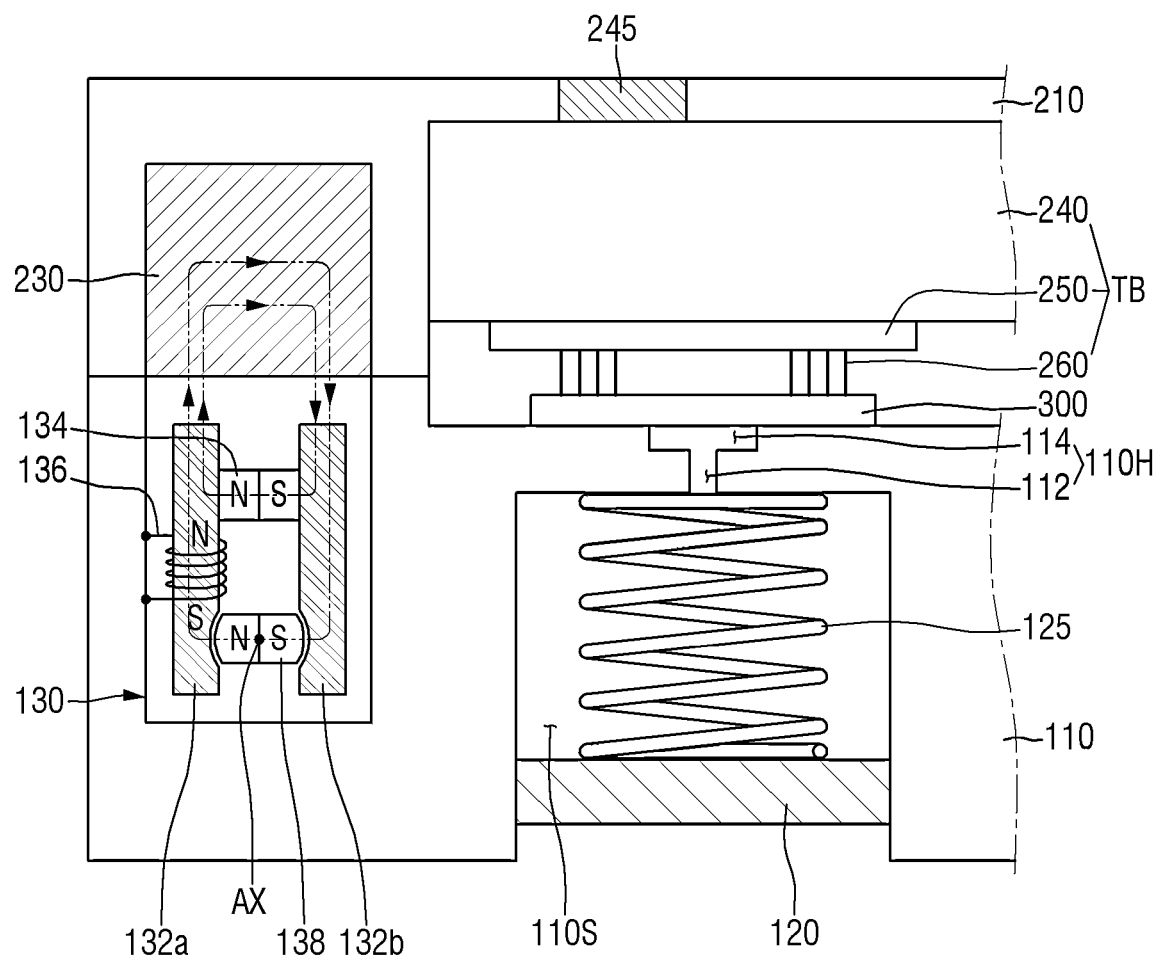

Referring to FIG. 13, the second module 200 is attached onto the first module 100.

Specifically, the second module 200 may be attached onto the first module 100 as the attractive force is generated between the magnetic force control unit 130 and the attachable/detachable member 230. When the second module 200 is attached onto the first module 100, the needles 260 of the test board TB may be in contact with the first target semiconductor device 300. Accordingly, the test board TB may be electrically connected to the first target semiconductor device 300.

Figure 14:
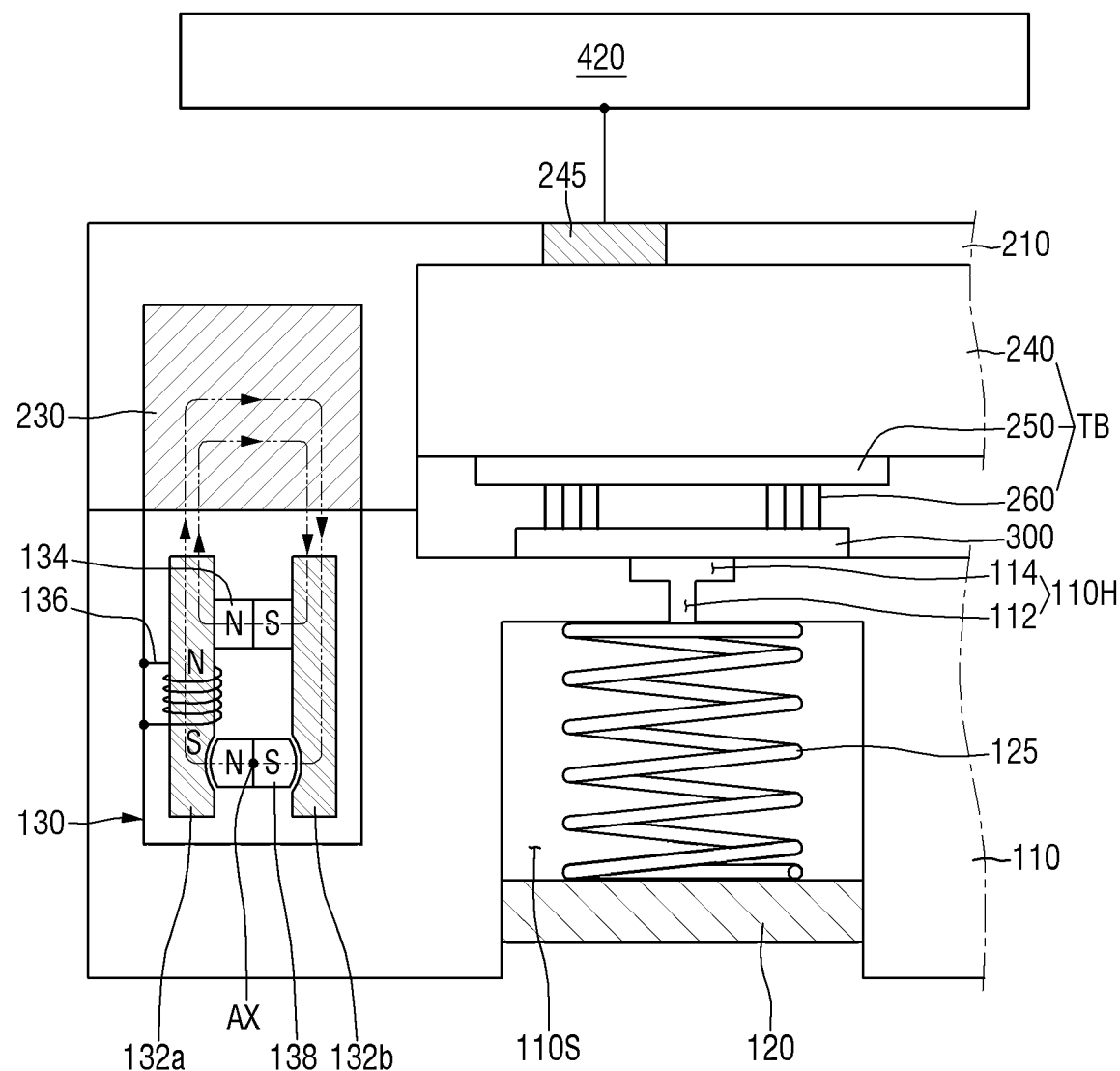

Referring to FIG. 14, the first target semiconductor device 300 is tested.

For example, the tester 420 may be provided to apply an electrical signal to a test apparatus for a semiconductor device according to some example embodiments. The tester 420 may include, but not necessarily, e.g., an automated test equipment (ATE).

In some example embodiments, the tester 420 may be electrically connected to the connection pad 245 of the second module 200.

The tester 420 may transmit an electrical signal to the test board TB through the connection pad 245, and the transmitted electrical signal may be applied to the first target semiconductor device 300 through the needles 260. Further, the electric signal outputted from the electrode terminal of the first target semiconductor device 300 may be provided to the test board TB through the needles 260, and the electrical signal provided to the test board TB may be transmitted to the tester 420 through the connection pad 245. Accordingly, the tester 420 may determine whether or not the first target semiconductor device 300 is defective.

Figure 15:
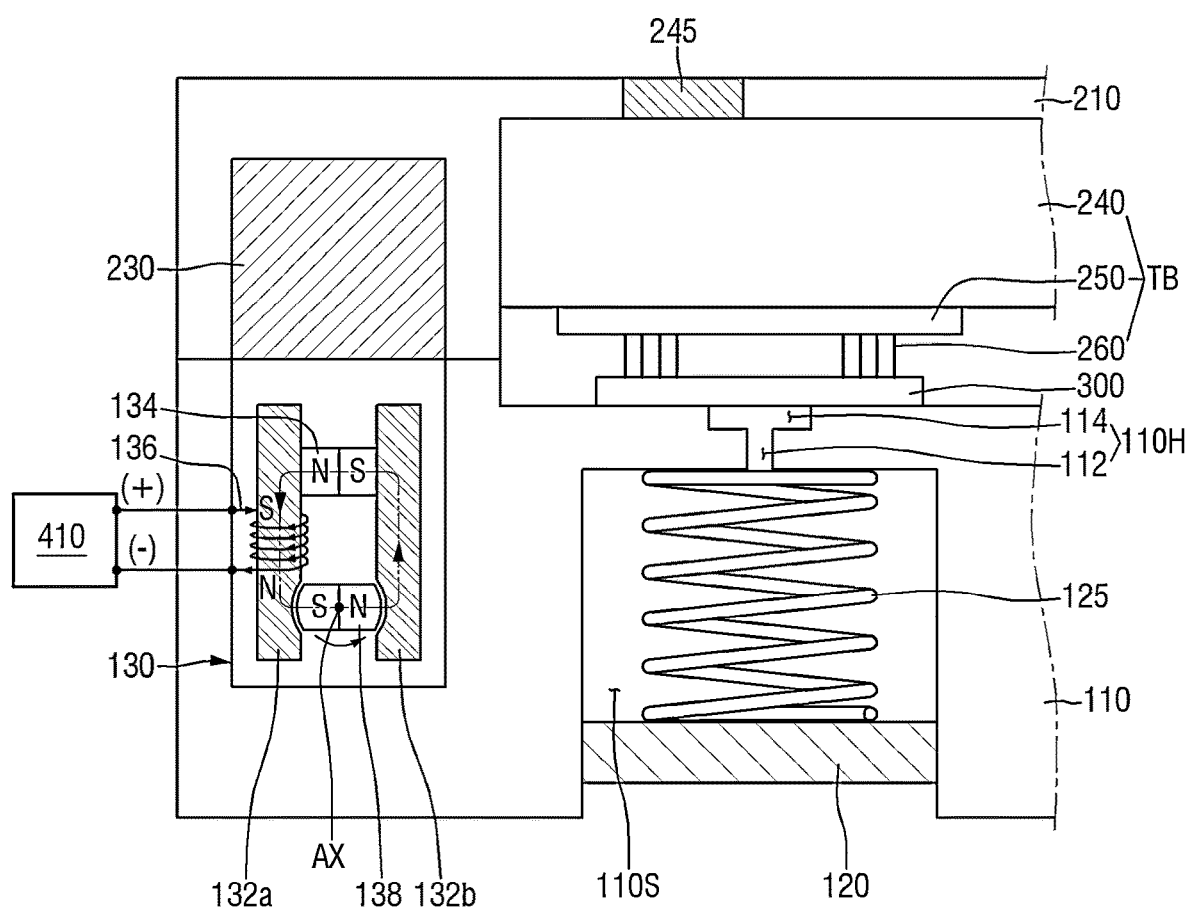

Referring to FIG. 15, the attractive force between the magnetic force control unit 130 and the attachable/detachable member 230 is eliminated.

After the first target semiconductor device 300 is tested by the tester 420, a current may be applied to the coil 136 of the magnetic force control unit 130. For example, the power supply 410 for applying a current to the coil 136 may be provided. For example, the power supply 410 may apply a direct current (DC) of about 20V to about 30V to the coil 136. Accordingly, the coil 136 may form an electromagnet.

The electromagnet formed by the coil 136 may control the magnetic flow of the permanent magnet 134 to eliminate the attractive force between the magnetic force control unit 130 and the attachable/detachable member 230. For example, the S pole of the electromagnet formed by the coil 136 may face the N pole of the permanent magnet 134. Further, for example, the N pole of the electromagnet formed by the coil 136 may face the rotating permanent magnet 138. Accordingly, the rotating permanent magnet 138 may be rotated and arranged in the first arrangement state. For example, as illustrated, the S pole of the rotating permanent magnet 138 may face the second pole piece 132a, and the N pole of the rotating permanent magnet 138 may face the third pole piece 132b.

Accordingly, a strong magnetic flow circulating through the permanent magnet 134, the second pole piece 132a, and the third pole piece 132b is generated, so that the magnetic flow circulating through the permanent magnet 134 and the attachable/detachable member 230 may be eliminated. In other words, the attractive force between the magnetic force control unit 130 and the attachable/detachable member 230 may be eliminated.

Figure 16:
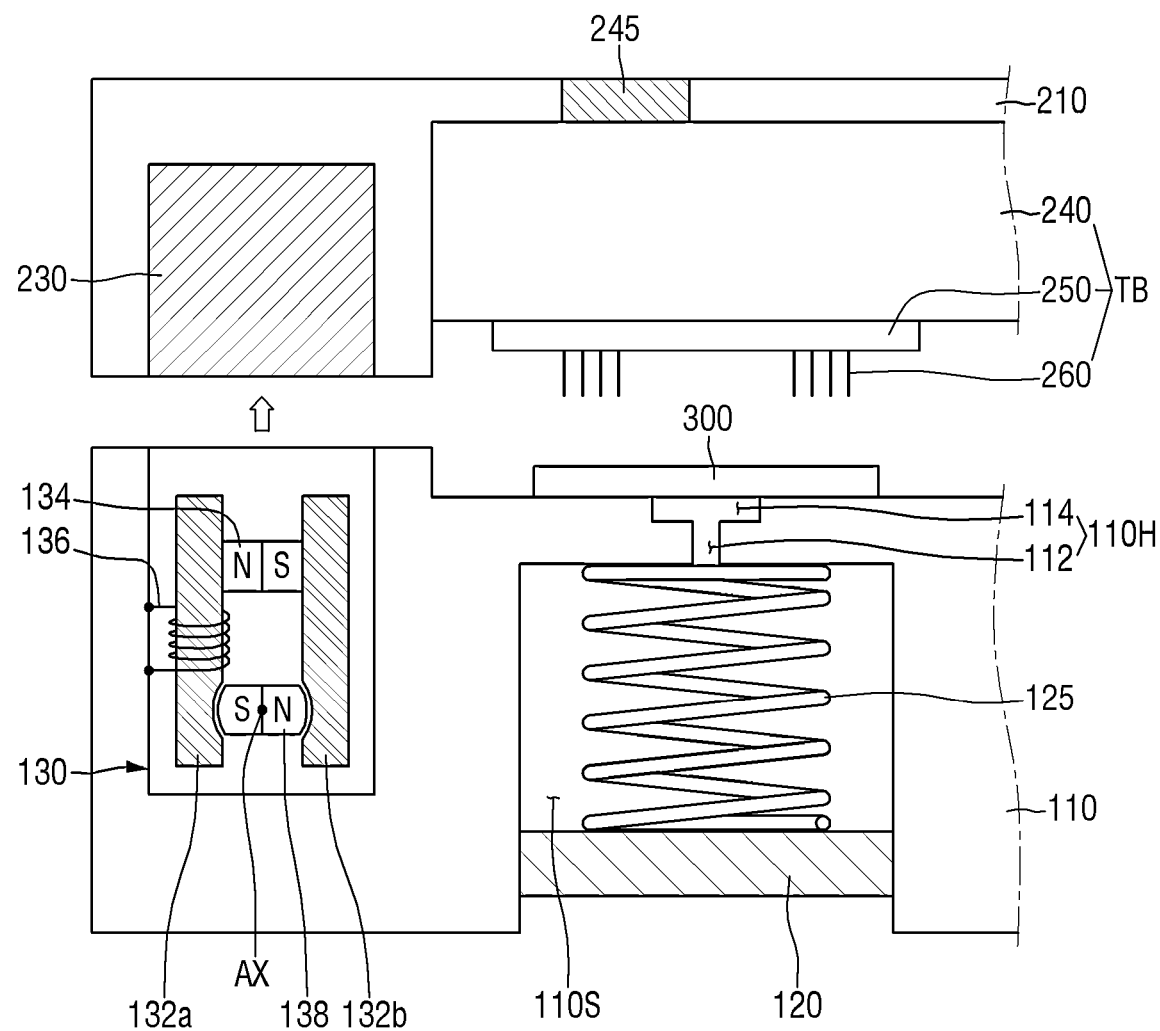

Referring to FIG. 16, the second module 200 is detached from the first module 100.

Specifically, the second module 200 may be detached from the first module 100 as the attractive force between the magnetic force control unit 130 and the attachable/detachable member 230 is eliminated. When the second module 200 is detached from the first module 100, the needles 260 of the test board TB may be separated from the first target semiconductor device 300. Accordingly, the electrical connection between the test board TB and the first target semiconductor device 300 may be released.

Figure 17:
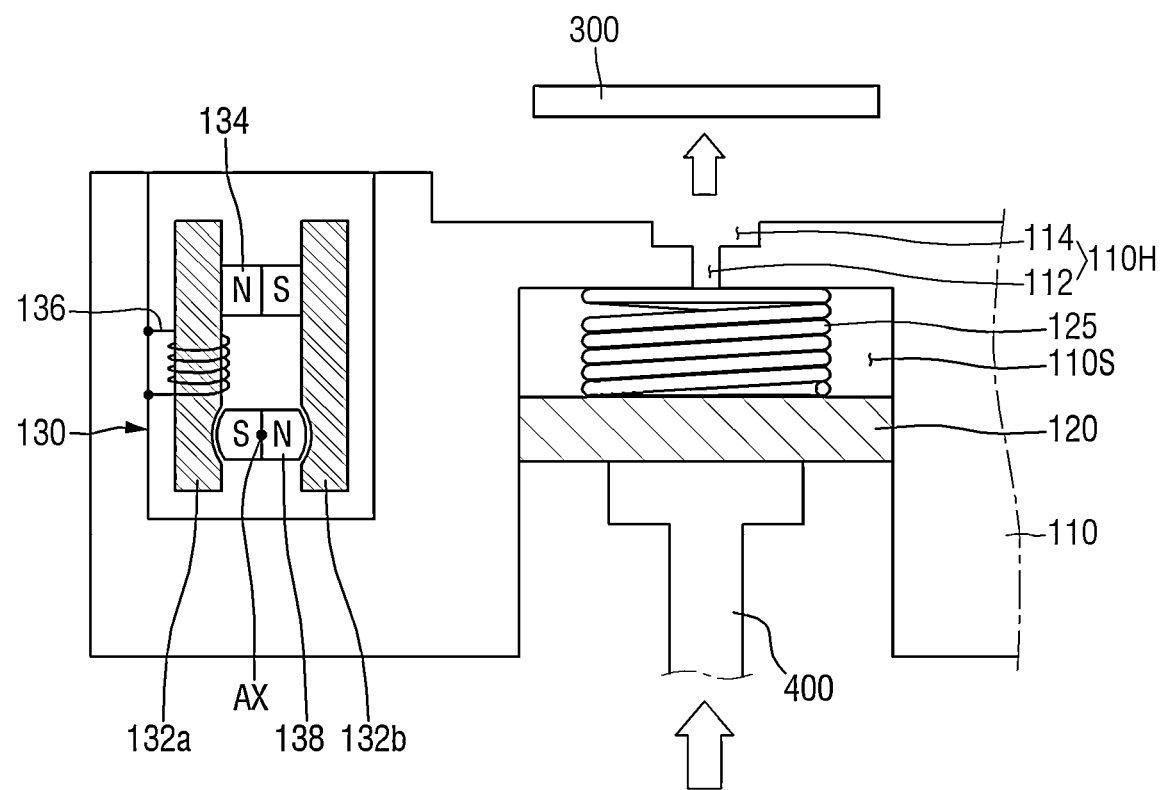
FIG. 17 is a schematic view illustrating a test apparatus for a semiconductor device according to some example embodiments.

FIG. 17 is a schematic view illustrating a test apparatus for a semiconductor device according to some example embodiments. Referring to FIG. 17, the volume control unit 120 reduces the volume of the inner space 110S of the first housing 110.

In one example, the pressing member 400 may be disposed on the bottom surface of the volume control unit 120. The pressing member 400 may apply a force to the volume control unit 120 to reduce the volume of the inner space 110S of the first housing 110. For example, the pressing member 400 may be moved toward the mounting unit 110H to push up the volume control unit 120.

In some example embodiments, as the volume of the inner space 110S of the first housing 110 is reduced, the pressure in the inner space 110S of the first housing 110 may be increased. For example, the pressure in the inner space 110S of the first housing 110 may be increased to the same level as the external pressure (e.g., the atmospheric pressure). Accordingly, the mounting unit 110H communicating with the inner space 110S of the first housing 110 may release the attraction of the first target semiconductor device 300, and the first target semiconductor device 300 may be detached from the first module 100.

As high integration of a semiconductor technology advances, studies have been conducted on various test apparatuses and test methods for more efficient inspection. However, a conventional test apparatus has a problem of low efficiency because it constantly requires energy to mount the semiconductor device or to maintain the engagement of modules.

However, a test apparatus for a semiconductor device according to some example embodiments may include the first module 100 and the second module 200 to improve test efficiency.

Specifically, as described above, in a test apparatus for a semiconductor device according to some example embodiments, the first target semiconductor device 300 may be mounted using the volume control unit 120 of the first module 100. The first target semiconductor device 300 mounted using the volume control unit 120 may be fixed to the first module 100 even during the test performed by the tester 420 without applying additional energy. Accordingly, a test apparatus for a semiconductor device according to some example embodiments may improve the test efficiency, compared to a conventional test apparatus for fixing a test object by providing vacuum from the outside using a pump or the like during a test.

Further, as described above, a test apparatus for a semiconductor device according to some example embodiments may attach/detach the first module 100 to/from the second module 200 using the magnetic force control unit 130 and the attachable/detachable member 230. The attachment between the first module 100 and the second module 200 ensured by the magnetic force control unit 130 and the attachable/detachable member 230 may be maintained even during the test performed by the tester 420 without applying additional energy. Accordingly, a test apparatus for a semiconductor device according to some example embodiments may improve the test efficiency, compared to a conventional test apparatus for maintaining the attachment by providing a power during a test.

Further, a test apparatus for a semiconductor device according to some example embodiments has high mobility because it does not require an additional external device for maintaining the attachment between the first module 100 and the second module 200. Further, a test apparatus for a semiconductor device according to some example embodiments is advantageous in that it is easily connected to various external devices. Accordingly, a test apparatus for a semiconductor device according to some example embodiments may further improve the test efficiency because it is easy to deal with required conditions (a pressure, a temperature, and the like).

Further, a test apparatus for a semiconductor device according to some example embodiments includes the plurality of inner spaces 110S and the plurality of mounting units 110H, so that it is possible to individually control the first target semiconductor devices 300 to be mounted thereon. Accordingly, the test efficiency may be further improved due to excellent independence.

Figure 18:
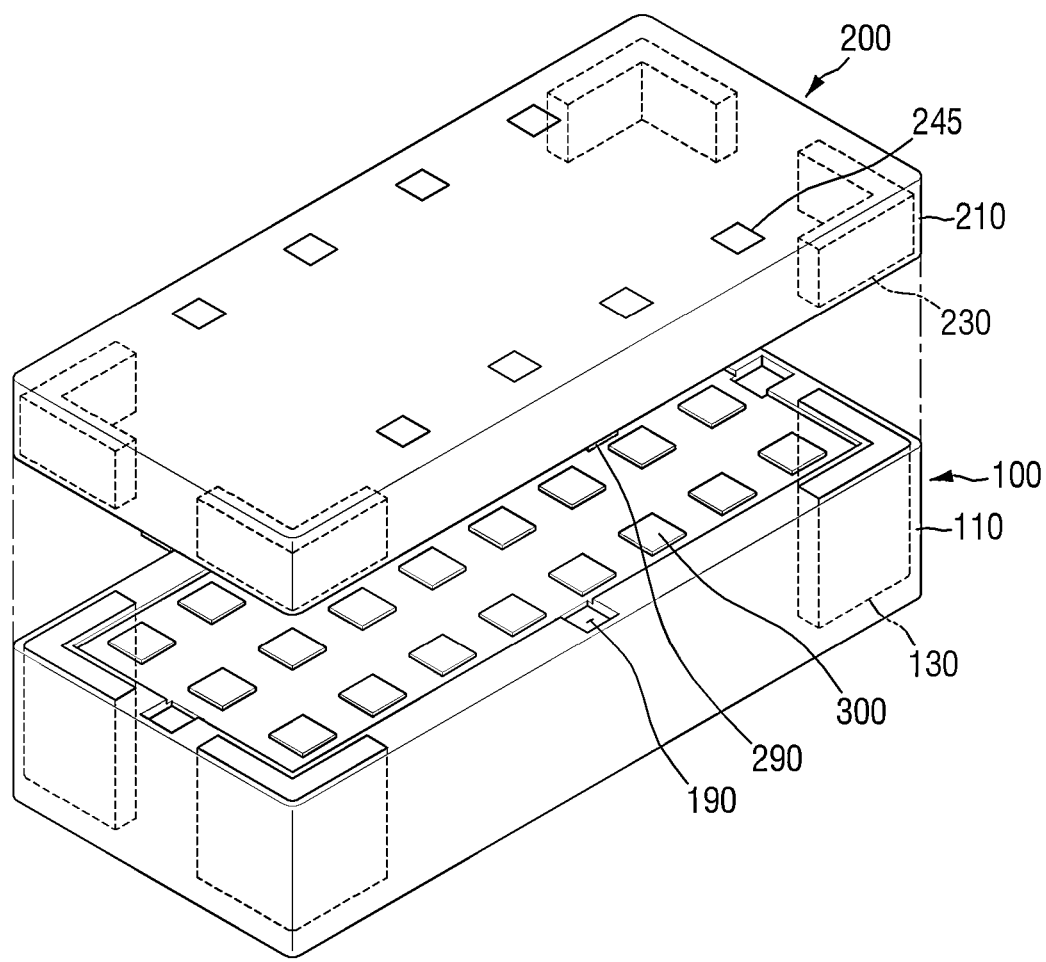
FIG. 18 is a schematic perspective view illustrating a test apparatus for a semiconductor device according to some example embodiments.

FIG. 18 is a schematic perspective view illustrating a test apparatus for a semiconductor device according to some example embodiments. For simplicity of description, redundant parts of the description made with reference to FIGS. 1 to 17 may be recapitulated or omitted.

Referring to FIG. 18, in a test apparatus for a semiconductor device according to some example embodiments, the magnetic force control unit 130 may be disposed in the corner of the first housing 110.

For example, four magnetic force control units 130 may be arranged in the corners of the first housing 110.

At least a part of the attachable/detachable member 230 may be disposed in the second housing 210 to correspond to the magnetic force control unit 130 of the first module 100.

For example, four attachable/detachable members 230 corresponding to four magnetic force control units 130 may be disposed in the corners of the second housing 210.

In some example embodiments, the recess 190 of the first housing 110 may not overlap the magnetic force control unit 130, and the protrusion 290 of the second housing 210 may not overlap the attachable/detachable member 230. For example, the recess 190 of the first housing 110 may be disposed in the sidewall of the first housing 110, and the protrusion 290 of the second housing 210 may be disposed in the sidewall of the second housing 210.

Figure 19:
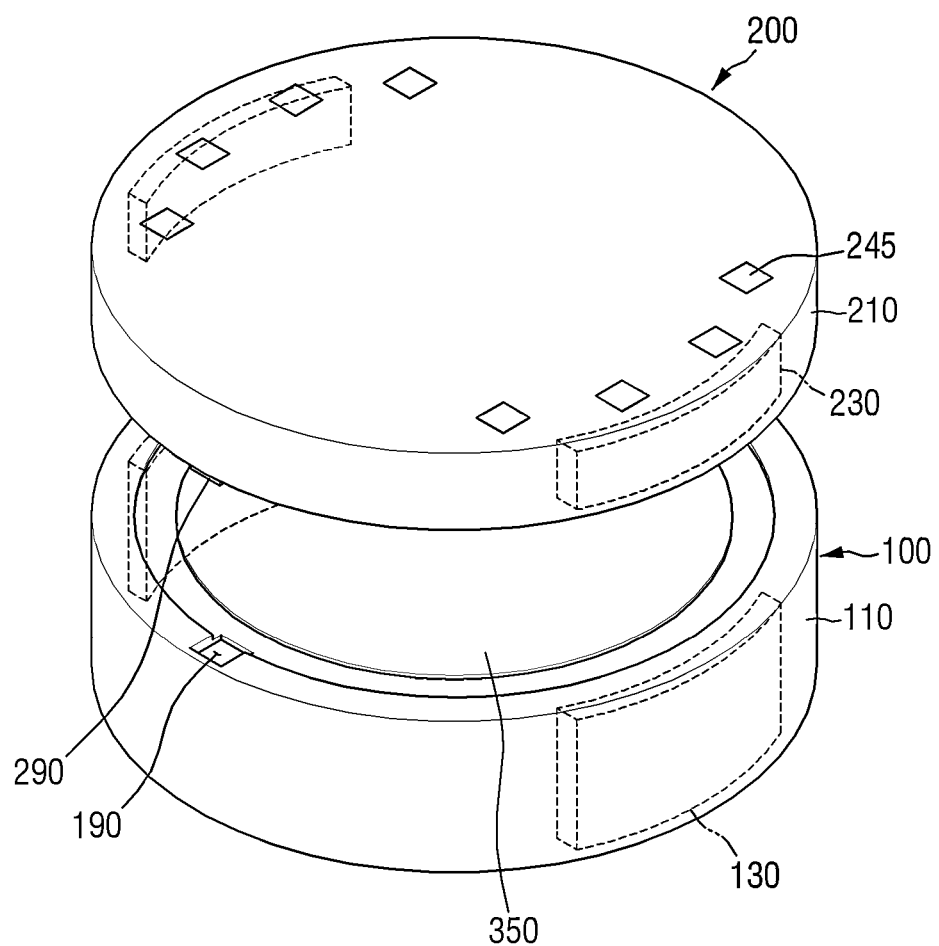
FIG. 19 is a schematic perspective view illustrating a test apparatus for a semiconductor device according to some example embodiments.

FIG. 19 is a schematic perspective view illustrating a test apparatus for a semiconductor device according to some example embodiments. For simplicity of description, redundant parts of the description made with reference to FIGS. 1 to 17 may be recapitulated or omitted.

Referring to FIG. 19, in a test apparatus for a semiconductor device according to some example embodiments, a second target semiconductor device 350 may be mounted on the first module 100.

The second target semiconductor device 350 may be a test object whose electrical characteristics are inspected by a test apparatus for a semiconductor device according to some example embodiments. For example, the second target semiconductor device 350 may be a wafer.

In some example embodiments, the second target semiconductor device 350 may have a circular plate shape. In that case, the first module 100 may have a cylindrical shape. For example, the first housing 110 may have a cylindrical shape. The magnetic force control unit 130 may be disposed in the sidewall of the cylindrical first housing 110. The magnetic force control unit 130 may, but not necessarily, have a curved surface.

In some example embodiments, the second module 200 may have a cylindrical shape corresponding to the first module 100. For example, the second housing 210 may have a cylinder shape corresponding to the first housing 110. The attachable/detachable member 230 may be disposed in the sidewall of the cylindrical second housing 210. The attachable/detachable member 230 may, but not necessarily, have a curved surface.

Figure 20:
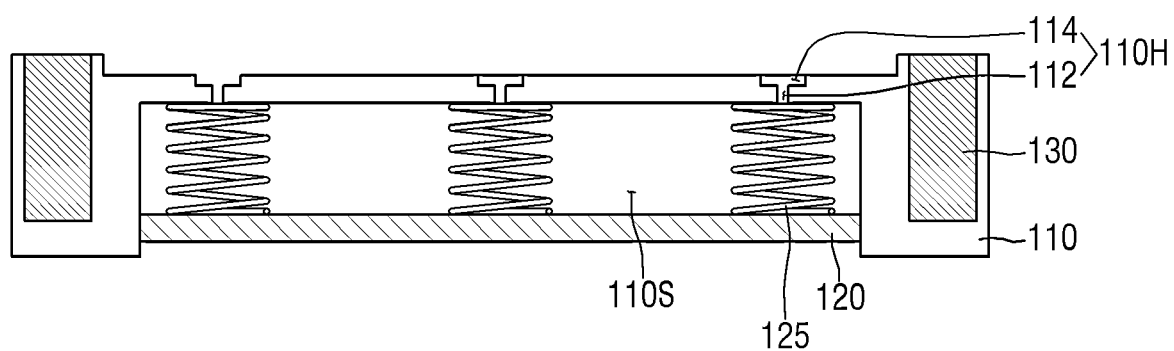
FIG. 20 is a schematic cross-sectional view illustrating a first module of a test apparatus for a semiconductor device according to some example embodiments.

FIG. 20 is a schematic cross-sectional view illustrating a first module of a test apparatus for a semiconductor device according to some example embodiments. For simplicity of description, redundant parts of the description made with reference to FIGS. 1 to 17 may be recapitulated or omitted.

Referring to FIG. 20, in a test apparatus for a semiconductor device according to some example embodiments, the plurality of mounting units 110H may share the inner space 110S of the first housing 110.

For example, the inner space 110S of the first housing 110 may be integrally formed and communicate with the plurality of mounting units 110H. In some example embodiments, the volume control unit 120 may be integrally formed to control the volume of the inner space 110S of the first housing 110.

In some example embodiments, a plurality of elastic bodies 125 may be disposed in the inner space 110S of the first housing 110.

Figure 21:
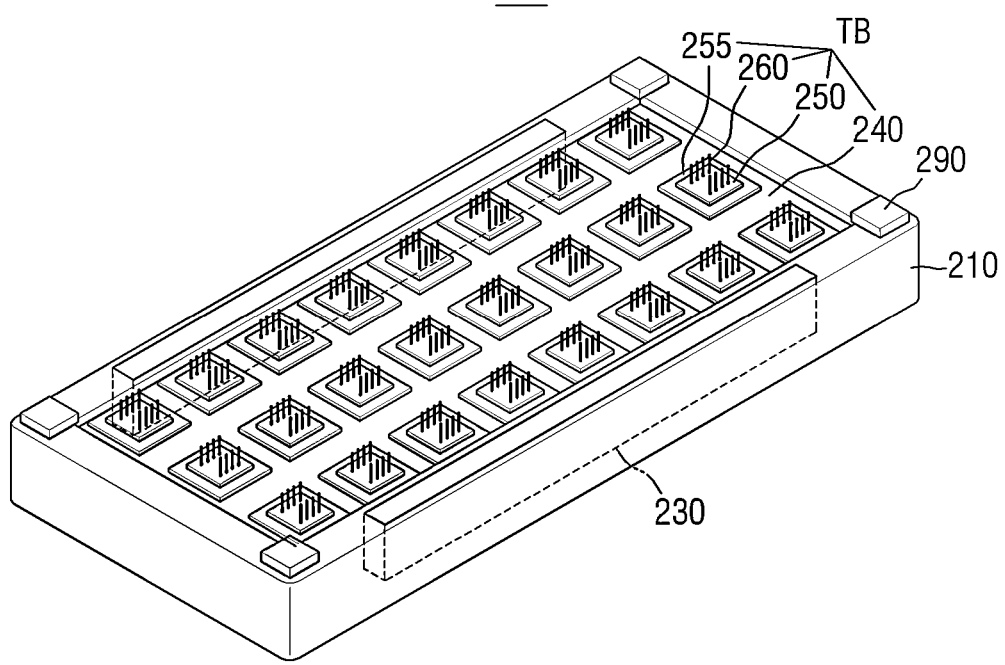
FIG. 21 is a schematic perspective view illustrating a second module of a test apparatus for a semiconductor device according to some example embodiments.

FIG. 21 is a schematic perspective view illustrating a second module of a test apparatus for a semiconductor device according to some example embodiments. For simplicity of description, redundant parts of the description made with reference to FIGS. 1 to 17 may be recapitulated or omitted.

Referring to FIG. 21, in a test apparatus for a semiconductor device according to some example embodiments, the test board TB may further include a fixing board 255.

The fixing board 255 may be disposed on the circuit board 240. The tile board 250 may be attached to or detached from the circuit board 240 via the fixing board 255. For example, the tile board 250 may be attached to or detached from the fixing board 255. Accordingly, it is easy to replace the test board TB, and a test apparatus for a semiconductor device having improved efficiency and productivity may be provided.

Although examples according to the technical idea of the inventive concepts have been described above referring to the attached drawings, the inventive concepts is not limited to the above examples and may be fabricated in various different forms. Those who have ordinary knowledge in the technical field to which the inventive concepts belongs will understand that the inventive concepts can be carried out in other specific forms without changing the technical idea or features of the inventive concepts. Therefore, it should be understood that the examples described above are examples in all respects and are not limitative.

What is claimed is:

1. A test apparatus for a semiconductor device, the test apparatus comprising:
    a first module configured to structurally support a target semiconductor device on an upper surface of the first module; and
    a second module that is reversibly attachable to the first module,
    wherein the first module includes a first housing including one or more inner surfaces at least partially defining an inner space, a volume control unit configured to control a volume of the inner space, a mounting unit at least partially exposed to the inner space and configured to be exposed to the target semiconductor device that is structurally supported on the upper surface of the first module, and a magnetic force control unit in the first housing,
    wherein the second module includes a second housing, a test board in the second housing, and an attachable/detachable member in the second housing, wherein the test board is configured to be electrically connected to the target semiconductor device that is structurally supported on the upper surface of the first module, and
    wherein the magnetic force control unit is configured to control a magnetic property of the attachable/detachable member to cause the attachable/detachable member to attach to the magnetic force control unit or detach from the magnetic force control unit.

2. The test apparatus of claim 1, wherein the test board includes a circuit board fixed to the first housing, a tile board on the circuit board, and a plurality of needles protruding from the tile board and configured to be connected to the target semiconductor device that is structurally supported on the upper surface of the first module.

3. The test apparatus of claim 1, wherein the mounting unit includes
    an attracting portion exposed from a surface of the first housing, and
    a communicating portion configured to connect the attracting portion to the inner space.

4. The test apparatus of claim 3, wherein a width of the attracting portion is larger than a width of the communicating portion.

5. The test apparatus of claim 1, wherein the first module further includes an elastic body in the inner space.

6. The test apparatus of claim 1, wherein the magnetic force control unit includes a permanent magnet and a coil, the coil being configured to control a magnetic flow of the permanent magnet.

7. The test apparatus of claim 1, wherein the attachable/detachable member includes a ferromagnetic material.

8. The test apparatus of claim 1, wherein the second module further includes a connection pad electrically connected to the test board and exposed from the second housing.

9. The test apparatus of claim 1, wherein the target semiconductor device includes a semiconductor package.

10. A test apparatus for a semiconductor device, the test apparatus comprising:
a first module configured to structurally support a target semiconductor device on an upper surface of the first module; and
a second module that is reversibly attachable to the first module,
wherein the first module includes a first housing including one or more inner surfaces at least partially defining an inner space, an elastic body in the inner space, a volume control unit configured to control a volume of the inner space based on at least partially compressing the elastic body, a mounting unit configured at least partially exposed to the inner space and configured to be exposed to the target semiconductor device that is structurally supported on the upper surface of the first module, and a magnetic force control unit in the first housing, and
wherein the second module includes a second housing, a connection pad exposed from the second housing, a test board in the second housing, and an attachable/detachable member in the second housing, wherein the test board is configured to be electrically connected to the target semiconductor device that is structurally supported on the upper surface of the first module, wherein the attachable/detachable member includes a magnetic material such that the attachable/detachable member is configured to be attached to the magnetic force control unit and detached from the magnetic force control unit.

11. The test apparatus of claim 10, wherein the test board includes a circuit board fixed to the first housing, a tile board on the circuit board, and a plurality of needles protruding from the tile board and configured to be connected to the target semiconductor device that is structurally supported on the upper surface of the first module.

12. The test apparatus of claim 10, wherein the first housing is configured to be engaged with the second housing.

13. The test apparatus of claim 10, wherein
the magnetic force control unit is in a sidewall of the first housing, and
the attachable/detachable member is in a sidewall of the second housing.

14. The test apparatus of claim 10, wherein the elastic body includes a spring.

15. A test apparatus for a semiconductor device, the test apparatus comprising:
a first module configured to structurally support a target semiconductor device on an upper surface of the first module; and
a second module including a test board, the test board configured to be electrically connected to the target semiconductor device that is structurally supported on the upper surface of the first module,
wherein the first module includes
a housing including one or more inner surfaces at least partially defining an inner space,
a mounting unit at least partially exposed to the inner space and configured to be exposed to the target semiconductor device that is structurally supported on the upper surface of the first module,
a volume control unit configured to control a volume of the inner space to fix the target semiconductor device that is structurally supported on the upper surface of the first module on the mounting unit, and
a magnetic force control unit in the housing, the magnetic force control unit including a permanent magnet and a coil, the coil being configured to control a magnetic flow of the permanent magnet.

16. The test apparatus of claim 15, wherein the volume control unit is configured to
reduce the volume of the inner space prior to the target semiconductor device being disposed on the mounting unit, and
increase the volume of the inner space after the target semiconductor device is disposed on the mounting unit.

17. The test apparatus of claim 16, wherein
the first module further includes an elastic body in the inner space,
the volume control unit is configured to reduce the volume of the inner space based on compressing the elastic body, and
the elastic body is configured to increase the volume of the inner space.

18. The test apparatus of claim 15, wherein
the magnetic force control unit further includes a pole piece configured to connect both poles of the permanent magnet, and
the coil is wound around at least a part of the pole piece.

19. The test apparatus of claim 15, wherein
the magnetic force control unit further includes
a first pole piece connected to an N pole of the permanent magnet,
a second pole piece isolated from direct contact with the first pole piece and connected to an S pole of the permanent magnet, and
a rotating permanent magnet between the first pole piece and the second pole piece,
the rotating permanent magnet being configured to be rotatable, and
the coil is wound around at least one of the first pole piece or the second pole piece.

20. The test apparatus of claim 15, wherein the second module includes an attachable/detachable member, and the magnetic force control unit is configured to a magnetic property of the attachable/detachable member to cause the attachable/detachable member to attach to the magnetic force control unit or detach from the magnetic force control unit.

* * * * *